US012610500B2

(12) United States Patent
Lu et al.

(10) Patent No.: US 12,610,500 B2
(45) Date of Patent: *Apr. 21, 2026

(54) CONNECTOR ASSEMBLY

(71) Applicant: Molex, LLC, Lisle, IL (US)

(72) Inventors: You-Qian Lu, New Taipei (TW);
Che-Yuan Yang, New Taipei (TW)

(73) Assignee: Molex, LLC, Lisle, IL (US)

( * ) Notice: Subject to any disclaimer, the term of this
patent is extended or adjusted under 35
U.S.C. 154(b) by 0 days.

This patent is subject to a terminal dis-
claimer.

(21) Appl. No.: 18/304,386

(22) Filed: Apr. 21, 2023

(65) Prior Publication Data

US 2023/0262929 A1     Aug. 17, 2023

Related U.S. Application Data

(63) Continuation of application No. 17/095,749, filed on
Nov. 12, 2020, now Pat. No. 11,653,474.

(60) Provisional application No. 62/960,696, filed on Jan.
14, 2020, provisional application No. 62/938,178,
filed on Nov. 20, 2019.

(30) Foreign Application Priority Data

May 12, 2020     (CN) .......................... 202010397463.1

(51) Int. Cl.
H01R 13/6584     (2011.01)
H01R 13/533     (2006.01)
H05K 7/20     (2006.01)

(52) U.S. Cl.
CPC ....... H05K 7/20272 (2013.01); H01R 13/533
(2013.01); H01R 13/6584 (2013.01); **H05K
7/20263 (2013.01); H05K 7/20436** (2013.01)

(58) Field of Classification Search
None
See application file for complete search history.

(56) References Cited

U.S. PATENT DOCUMENTS

| | | |
|---|---|---|
| 4,341,432 A | 7/1982 | Cutchaw |
| 4,721,996 A | 1/1988 | Tustaniwskyj et al. |
| 5,184,211 A | 2/1993 | Fox |
| 6,560,115 B1 | 5/2003 | Wakabayashi et al. |

(Continued)

FOREIGN PATENT DOCUMENTS

| | | |
|---|---|---|
| CN | 101330173 A | 12/2008 |
| CN | 203386957 U | 1/2014 |

(Continued)

*Primary Examiner* — Felix O Figueroa

(57)     ABSTRACT

The present disclosure provides a connector assembly com-
prising a shielding cage and a liquid cooling cabin. The
shielding cage has an insertion space and a window in
communication with the insertion space. The liquid cooling
cabin is configured to allow a cooling liquid to circulate and
flow inside, the liquid cooling cabin comprises a shell
having an opening, a thermal coupling cover provided at the
opening of the shell, and an elastic sealing unit sealing a gap
between the thermal coupling cover and the shell, the
thermal coupling cover having a thermal coupling plate
entering into the insertion space via the window of the
shielding cage, the thermal coupling plate being capable of
elastically moving in a direction close to the shell and
elastically restoring in a direction away from the shell by a
function of the elastic sealing unit.

14 Claims, 28 Drawing Sheets

(56)     References Cited

U.S. PATENT DOCUMENTS

| | | | | |
|---|---|---|---|---|
| 7,625,223 | B1 | 12/2009 | Fogg | |
| 7,852,633 | B2 | 12/2010 | Ito | |
| 9,474,152 | B2 * | 10/2016 | Sarraf | H05K 1/11 |
| 9,913,403 | B2 * | 3/2018 | Krug, Jr. | H05K 7/20781 |
| 10,856,446 | B2 | 12/2020 | Boyden et al. | |
| 11,297,734 | B2 * | 4/2022 | Lin | H04B 10/25 |
| 11,653,474 | B2 * | 5/2023 | Lu | H01R 13/6584 |
| | | | | 439/485 |
| 2003/0171033 | A1 | 9/2003 | Bright et al. | |
| 2016/0242313 | A1 * | 8/2016 | Singh | H05K 1/184 |
| 2019/0246523 | A1 | 8/2019 | Boyden et al. | |

FOREIGN PATENT DOCUMENTS

| | | | |
|---|---|---|---|
| CN | 104409913 | B | 4/2018 |
| CN | 207691070 | U | 8/2018 |
| CN | 209170817 | U | 7/2019 |
| CN | 110249718 | A | 9/2019 |
| TW | M458683 | U | 8/2013 |
| TW | I568083 | B | 1/2017 |

* cited by examiner

CONNECTOR ASSEMBLY

RELATED APPLICATION

This application is a continuation of U.S. application Ser. No. 17/095,749, filed on Nov. 12, 2020, which claims priority to Chinese Application No. 202010397463.1 filed on May 12, 2020, U.S. Provisional Application No. 62/938,178 filed on Nov. 20, 2019 and U.S. Provisional Application No. 62/960,696 filed on Jan. 14, 2020, all of which are incorporated herein by reference in their entirety.

TECHNICAL FIELD

The present disclosure relates to a connector assembly and, in particular, to a connector assembly having a heat sink.

BACKGROUND

U.S. Pat. No. 7,625,223 discloses a receptacle assembly, which comprises a guide frame, a heat sink and a conductive gasket. The guide frame comprises a top wall and defines an interior chamber configured to receive a mating connector. The top wall defines an opening in communication with the interior chamber. The heat sink is held in the interior chamber, so that when the mating connector is inserted into the interior chamber, an upper portion of the heat sink passes through the opening and a lower portion of the heat sink engages with the mating connector. The conductive gasket is held between the guide frame and the heat sink. The heat sink comprises a coupling portion, when the mating connector is inserted into the interior chamber, the coupling portion provides a heat transferring path for the mating connector. The conductive gasket is configured to be compressed between the guide frame and the heat sink, so that the conductive gasket provides a conductive path between the heat sink and the guide frame. However, the heat sink disclosed in this prior art generally is a metal heat sink having heat dissipating fins, whose principle is that heat is brought out by air flowing between the heat dissipating fins; however, heat dissipating efficacy is insufficient with respect to a connector assembly with higher transmission speeds and higher generated heat.

Chinese invention patent application publication No. CN110139534A (corresponding United States patent application publication No. 2019/0246523A1) discloses a cooling apparatus, which comprises a manifold and a plurality of pedestals. The manifold comprises a housing surrounding an interior cavity, the interior cavity receives a cooling liquid and allows the cooling liquid to flow and circulate. Each pedestal is individually and flexibly coupled to the housing of the manifold by a bellow which is used to seal and has annular shape. Each pedestal is configured to extend outwardly from a bottom surface of the housing of the manifold when a fluid pressure is present in the interior cavity. However, the bellow in this prior art only provides flexible connection between the pedestal and the manifold and only a fluid pressure is present in the interior cavity of the manifold, but the pedestal can be subjected to enough force so as to extend outwardly from the bottom surface of the housing of the manifold. First, the bellow as a connection sealing member between the pedestal and the manifold is not only complicated in configuration but also is high in manufacturing difficulty; second, because the pedestal only can extend outwardly under the fluid pressure, when the fluid pressure is not enough or is not stable, it easily results in that an amount of outwardly extending is not enough for the pedestal with respect to the manifold so that a pressure of the pedestal contacting an electrical module is not enough or that the pedestal does not contact the electrical module, which in turn reduces heat dissipation efficiency.

SUMMARY

Therefore, one of objects of the present disclosure is to provide a connector assembly which can improve at least one of deficiencies in prior art.

Therefore, in some embodiments, a connector assembly of the present disclosure comprises a shielding cage and a liquid cooling cabin. The shielding cage has an insertion space and a window in communication with the insertion space. The liquid cooling cabin is configured to allow a cooling liquid to circulate and flow inside, the liquid cooling cabin comprises a shell having an opening, a thermal coupling cover provided at the opening of the shell in sealing, and an elastic sealing unit sealing a gap between the thermal coupling cover and the shell, the thermal coupling cover has a thermal coupling plate entering into the insertion space via the window of the shielding cage, the thermal coupling plate is capable of elastically moving toward a direction close to the shell and elastically restoring toward a direction away from the shell by a function of the elastic sealing unit.

In some embodiments, the elastic sealing unit connects and applies to the thermal coupling plate In some embodiments, the elastic sealing unit connects and applies to the thermal coupling cover, and the thermal coupling cover together with the thermal coupling plate wholly move and restore with respect to the shell.

In some embodiments, the elastic sealing unit has an elastic component making that the thermal coupling plate can elastically move and restore, and a sealing component provided between the thermal coupling cover and the shell in sealing.

In some embodiments, the elastic sealing unit has an elastic sealing component which makes that the thermal coupling plate can elastically move and restore and which is provided between the thermal coupling cover and the shell in sealing.

Therefore, in some embodiments, a connector assembly of the present disclosure comprises a shielding cage and a liquid cooling cabin. The shielding cage has an insertion space and a window in communication with the insertion space. The liquid cooling cabin is configured to allow a cooling liquid to circulate and flow inside, the liquid cooling cabin comprises a shell having an opening and a thermal coupling cover and a sealing pad which are provided at the opening of the shell in sealing, the thermal coupling cover is made of a metal plate, the thermal coupling cover has a thermal coupling plate entering into the insertion space via the window of the shielding cage, a mounting frame surrounding the thermal coupling plate and provided at the opening of the shell in sealing, and a plurality of elastic connection pieces integrally connected between the thermal coupling plate and the mounting frame, the sealing pad seals a gap between the plurality of elastic connection pieces, the thermal coupling plate is capable of elastically moving toward a direction close to the shell and elastically restoring toward a direction away from the shell by a function of the elastic connection piece.

In some embodiments, the sealing pad further seals between the mounting frame of the thermal coupling cover and the shell.

In some embodiments, the sealing pad is provided on an inner side surface of the thermal coupling cover facing the shell by integral molding.

In some embodiments, the sealing pad is made of a rubber polymer material having electromagnetic shielding function.

In some embodiments, the liquid cooling cabin further comprises a latching member, the liquid cooling cabin is fixedly latched to the shielding cage by the latching member.

In some embodiments, the latching member is integrally configured from the thermal coupling cover, and the latching member latches to the shell and the shielding cage.

Therefore, in some embodiments, a connector assembly of the present disclosure comprises a shielding cage and a liquid cooling cabin. The shielding cage has an insertion space and a window in communication with the insertion space. The liquid cooling cabin is configured to allow a cooling liquid to circulate and flow inside, the liquid cooling cabin comprises a shell having an opening, a thermal coupling cover provided at the opening of the shell in sealing, and an elastic sealing unit sealing a gap between the thermal coupling cover and the shell, the thermal coupling cover has a thermal coupling plate entering into the insertion space via the window of the shielding cage, the whole the thermal coupling cover is capable of elastically moving toward a direction close to the shell and elastically restoring toward a direction away from the shell by a function of the elastic sealing unit.

In some embodiments, the elastic sealing unit has an elastic sealing gasket provided between the thermal coupling cover and the shell in sealing and applying to the thermal coupling cover, the thermal coupling cover further has a mounting frame integrally surrounding the thermal coupling plate, the elastic sealing gasket is interposed between the mounting frame of the thermal coupling cover and the shell in sealing.

In some embodiments, the shell further has a supporting edge portion defining the opening and a pressing edge portion positioned above the supporting edge portion, the mounting frame of the thermal coupling cover is positioned between the supporting edge portion and the pressing edge portion and supported on the supporting edge portion, the elastic sealing gasket is interposed between the mounting frame of the thermal coupling cover and the pressing edge portion in elastic pre-compression.

In some embodiments, the elastic sealing unit has an elastic member connected between the thermal coupling cover and the shell and applying to the thermal coupling cover, and a sealing gasket provided between the thermal coupling cover and the shell in sealing.

In some embodiments, the liquid cooling cabin further comprises a latching member, the liquid cooling cabin is fixedly latched to the shielding cage by the latching member.

In some embodiments, the connector assembly comprises two shielding cages which are arranged in the up-down direction and two liquid cooling cabins which are respectively provided to an upper side of the shielding cage positioned above and a lower side of the shielding cage positioned below, each shielding cage has a plurality of insertion spaces and a plurality of windows which respectively correspond to the corresponding liquid cooling cabins and respectively are in communication with the plurality of the insertion spaces, each liquid cooling cabin includes a plurality of thermal coupling covers, the thermal coupling plates of the plurality of the thermal coupling covers correspondingly enter into the plurality of the insertion spaces respectively via the window.

In some embodiments, the connector assembly comprises two shielding cages which are arranged in the up-down direction and one liquid cooling cabin which is provided between the two shielding cages, each shielding cage has a plurality of insertion spaces and the window which corresponds to the liquid cooling cabin and is in communication with the plurality of insertion spaces, the liquid cooling cabin comprises a plurality of the thermal coupling covers, the thermal coupling plates of the plurality of the thermal coupling covers correspondingly enter into the insertion spaces respectively via the window.

In the present disclosure, the liquid cooling cabin is directly assembled on the shielding cage, the liquid cooling cabin has the thermal coupling plate which can elastically move, the thermal coupling plate can elastically move toward a direction close to the shell responding to insertion of the pluggable module into the insertion space, and elastically restore after the pluggable module is pulled out from the insertion space, thereby providing more effective contact pressure between the thermal coupling plate and the pluggable module, and by that the thermal coupling plate which can elastically move directly contacts the heat source and the cooling liquid, heat dissipation efficiency of the liquid cooling cabin is enhanced. In an embodiment, by the thermal coupling cover, the thermal coupling plate which protrudes, the mounting frame and a plurality of elastic connection pieces integrally connected between the thermal coupling plate and the mounting frame, which are made of a metal plate, manufacturing cost is reduced, meanwhile the sealing pad integrally molded seals the gap between the elastic connection pieces and seals between the mounting frame of the thermal coupling cover and the shell. In another embodiment, the elastic sealing gasket seals the gap between the thermal coupling cover and the shell, meanwhile the function of the elastic sealing gasket makes that the whole thermal coupling cover can relatively elastically move toward the shell and elastic restore toward an opposite direction. In still another embodiment, the sealing gasket seals the gap between the thermal coupling cover and the shell, meanwhile the function of the elastic member makes that the whole thermal coupling cover can relatively elastically move toward the shell and elastically restore toward an opposite direction.

BRIEF DESCRIPTION OF THE DRAWINGS

Other features and effects of the present disclosure will be apparent from the embodiments illustrated in the accompanying drawings, in which.

DETAILED DESCRIPTION OF PREFERRED EMBODIMENT

Figure 1:
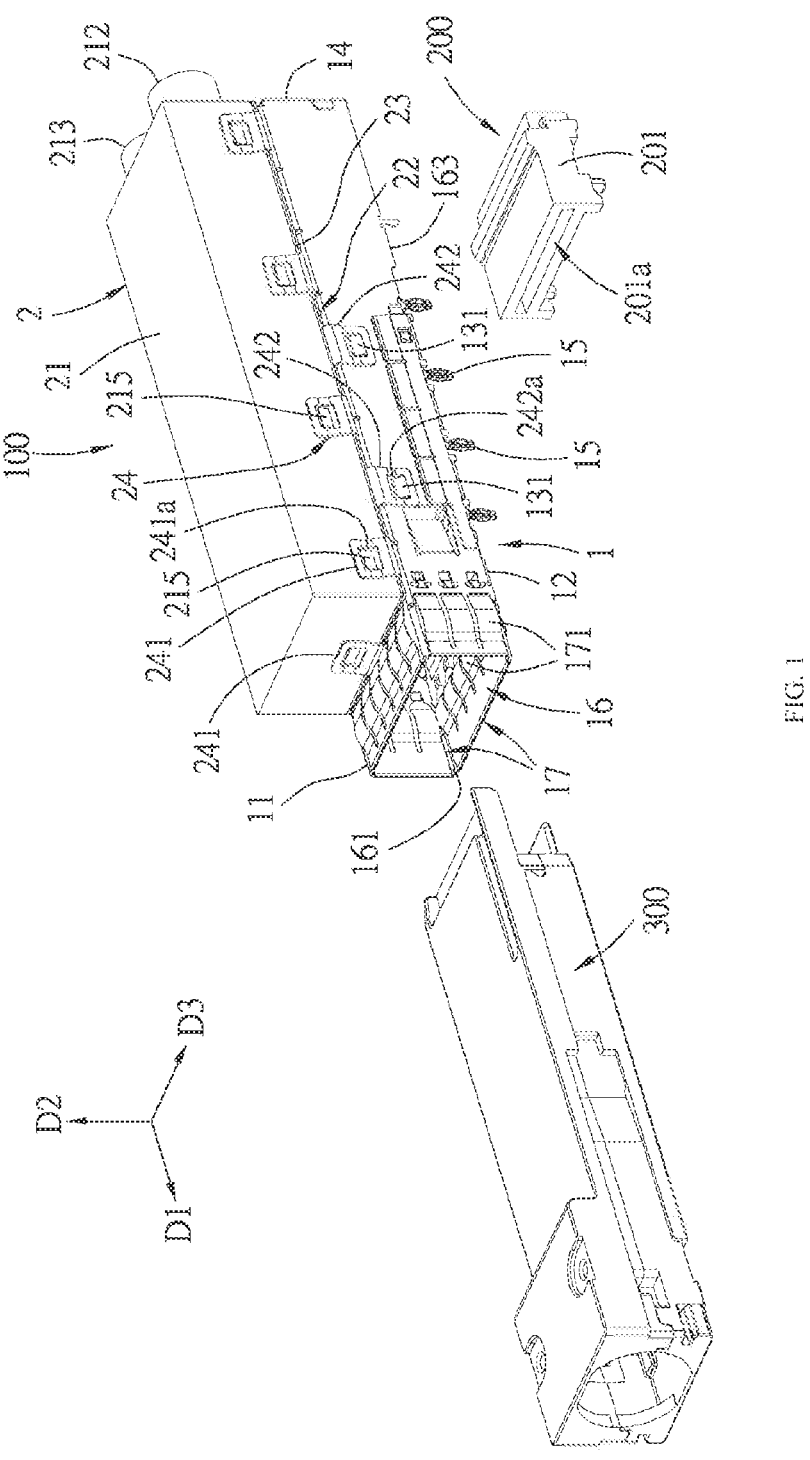
FIG. 1 is a perspective exploded view of a first embodiment of a connector assembly of the present disclosure, a receptacle connector and a pluggable module.

Before the present disclosure is described in detail, it should be noted that the similar components are indicated by the same reference numerals in the following description.

Figure 2:
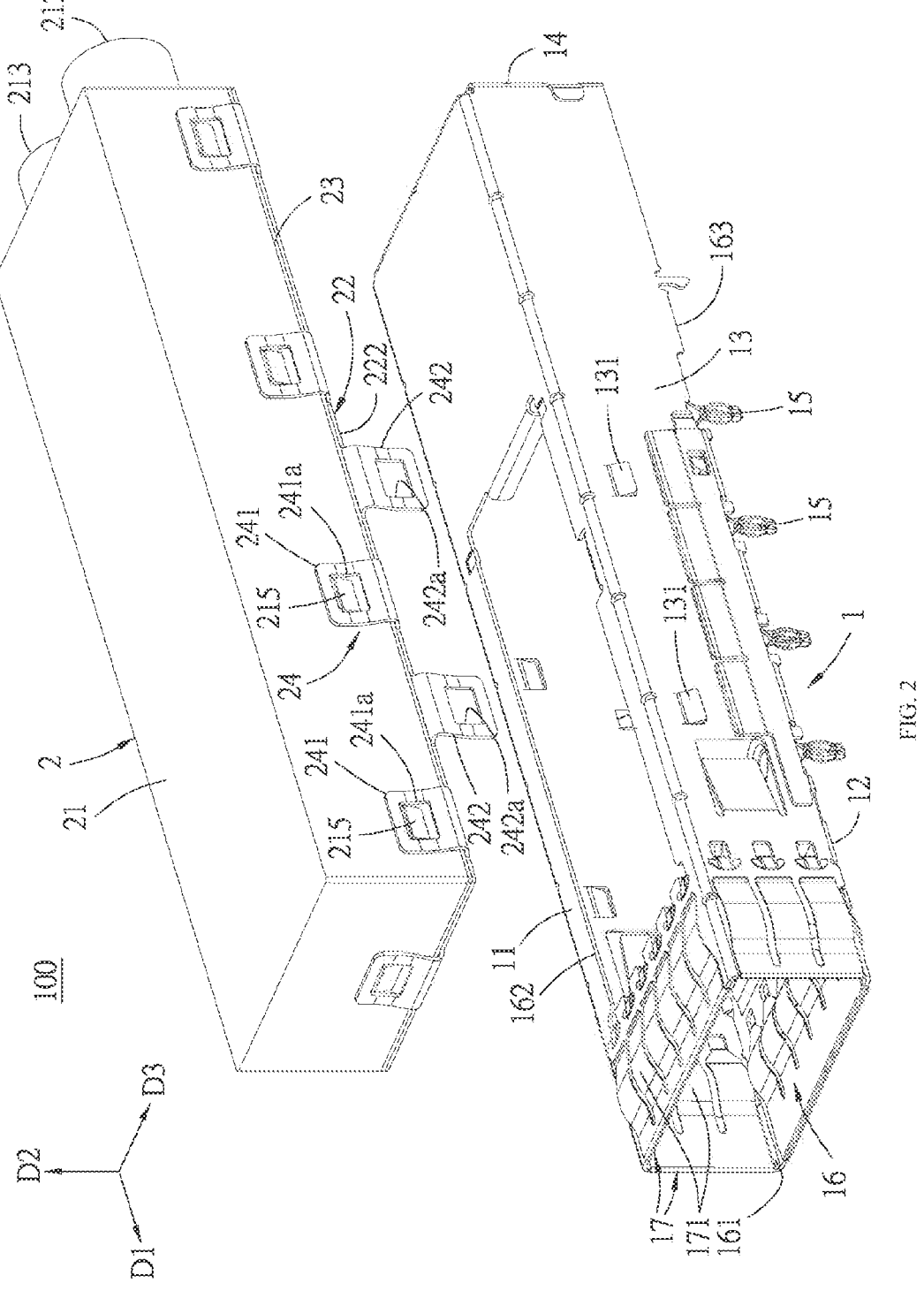
FIG. 2 is a perspective exploded view of the first embodiment.

Referring to FIG. 1 and FIG. 2, a first embodiment of a connector assembly 100 of the present disclosure is adapted to cover a receptacle connector 200 and is adapted to be mated with a pluggable module 300. The connector assembly 100 comprises a shielding cage 1 and a liquid cooling cabin 2.

The shielding cage 1, for example, may be a metal material, the shielding cage 1 extends along a front-rear direction D1 and has a top wall 11, a bottom wall 12 spaced apart from the top wall 11 and facing the top wall 11 along an up-down direction D2, two side walls 13 spaced apart from each other and facing each other along a left-right direction D3 and respectively connected to two sides of the top wall 11 and the bottom wall 12, a rear wall 14 positioned at a rear end and connected to a rear edge of the top wall 11 and rear edges of the two side walls 13, and a plurality of legs 15 extending downwardly from the two side walls 13 and adapted to be fixed on a circuit board (not shown) and/or connected to a grounding trace. The shielding cage 1 further has an insertion space 16 which is defined by the top wall 11, the bottom wall 12, the two side walls 13 and the rear wall 14 together and positioned inside, an inserting opening 161 positioned at a front end, in communication with the insertion space 16 and allowing the pluggable module 300 to insert, a window 162 formed to the top wall 11 and in communication with the insertion space 16, and a bottom opening 163 positioned at a rear side of the bottom wall 12 and in communication with the insertion space 16. The receptacle connector 200 is provided to a rear segment of the insertion space 16, and the receptacle connector 200 has a housing 201 and a plurality of terminals (not shown), the housing 201 has a slot 201a facing the inserting opening 161 and used to mate with the pluggable module 300, the plurality of terminals are positioned in the slot 201a and electrically and mechanically connected to the circuit board, specifically, the receptacle connector 200 is provided to the circuit board, and passes through the bottom opening 163 and is caged by the shielding cage 1, so the receptacle connector 200 is provided in the insertion space 16, but is not limited thereto, for example, each terminal of the receptacle connector 200 may not necessarily be connected to the circuit board but may instead connect to a cable. A plurality of grounding members 17 are provided at the inserting opening 161 which is positioned at the front end of the shielding cage 1, the grounding member 17 has a plurality of elastic fingers 171 which extend rearwardly from the inserting opening 161 and disposed at an outer side of the shielding cage 1 and an inner side of the shielding cage 1, the elastic fingers 171 which is positioned at the outer side of the shielding cage 1 is used to contact a case (not shown), the elastic fingers 171 which is positioned at the inner side of the shielding cage 1 is used to contact the pluggable module 300.

Referring to FIG. 3 to FIG. 7, the liquid cooling cabin 2 is configured to allow a cooling liquid to circulate and flow inside, the liquid cooling cabin 2 comprises a shell 21 having an opening 211 positioned at a bottom of the shell 21, a thermal coupling cover 22 provided at the opening 211 of the shell 21 in sealing, and an elastic sealing unit sealing a gap between he thermal coupling cover 22 and the shell 21. The cooling liquid, for example, may be water or other cooling liquid. A material of the shell 21 is, for example, metal (for example copper or aluminum) and further has an inlet opening 212 and an outlet opening 213 which are positioned at a rear end and allow the cooling liquid to respectively flow in and flow out, and a flowing passage 214 which is positioned inside and in communication between the inlet opening 212 and the outlet opening 213. The liquid cooling cabin 2 may cooperate with other constituent members of a liquid cooling heat dissipating system (not shown), so as to make the cooling liquid absorb heat from the liquid cooling cabin 2 and dissipate heat by the constituent members after the cooling liquid exits from the liquid cooling cabin 2, the constituent members, for example, have a liquid guiding pipe, a heat dissipation row, a heat dissipation fan, a pump, a water tank and the like.

Figure 5:
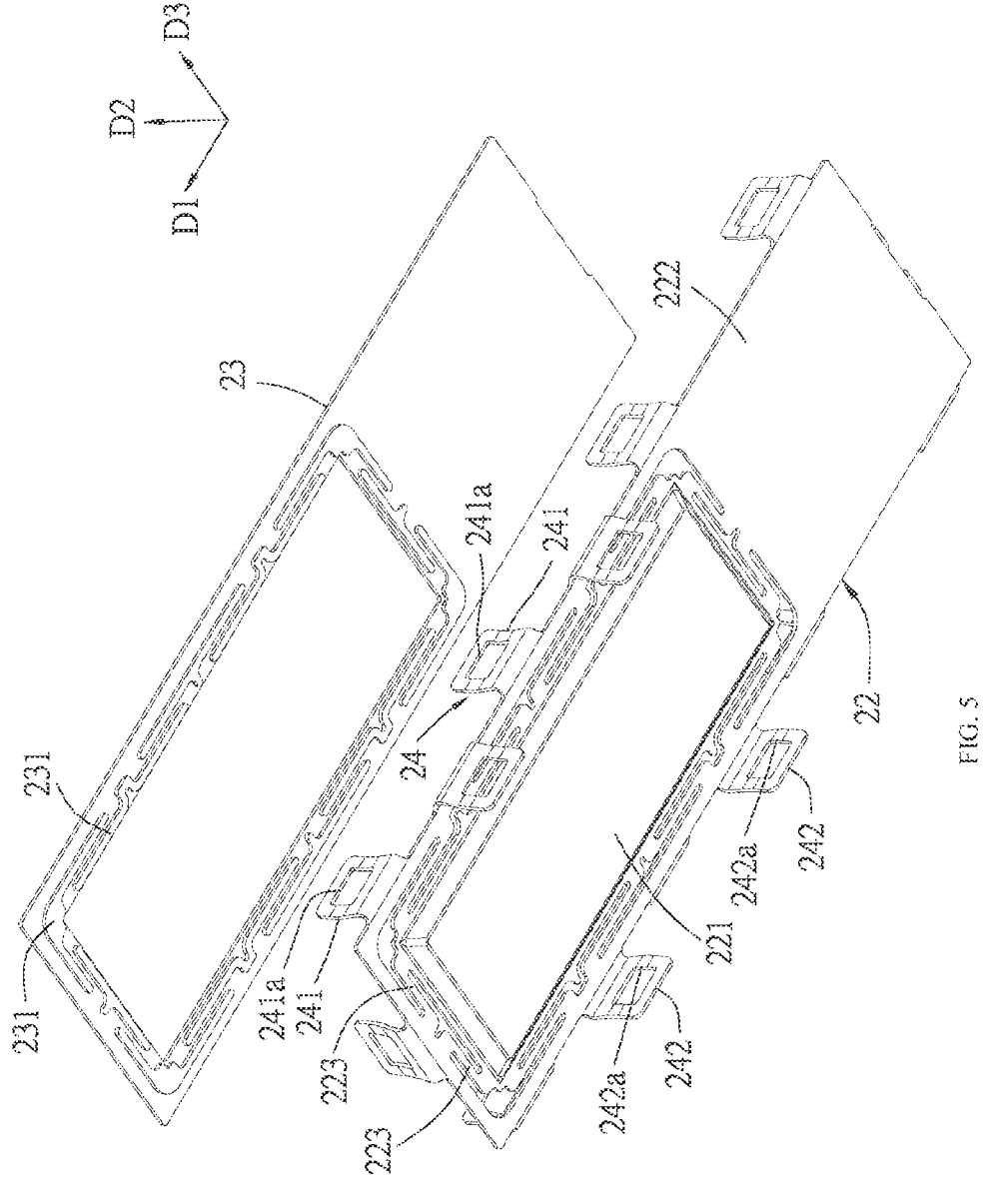
FIG. 5 is a perspective exploded view of a thermal coupling cover and a sealing pad of the liquid cooling cabin of the first embodiment.
Figure 6:
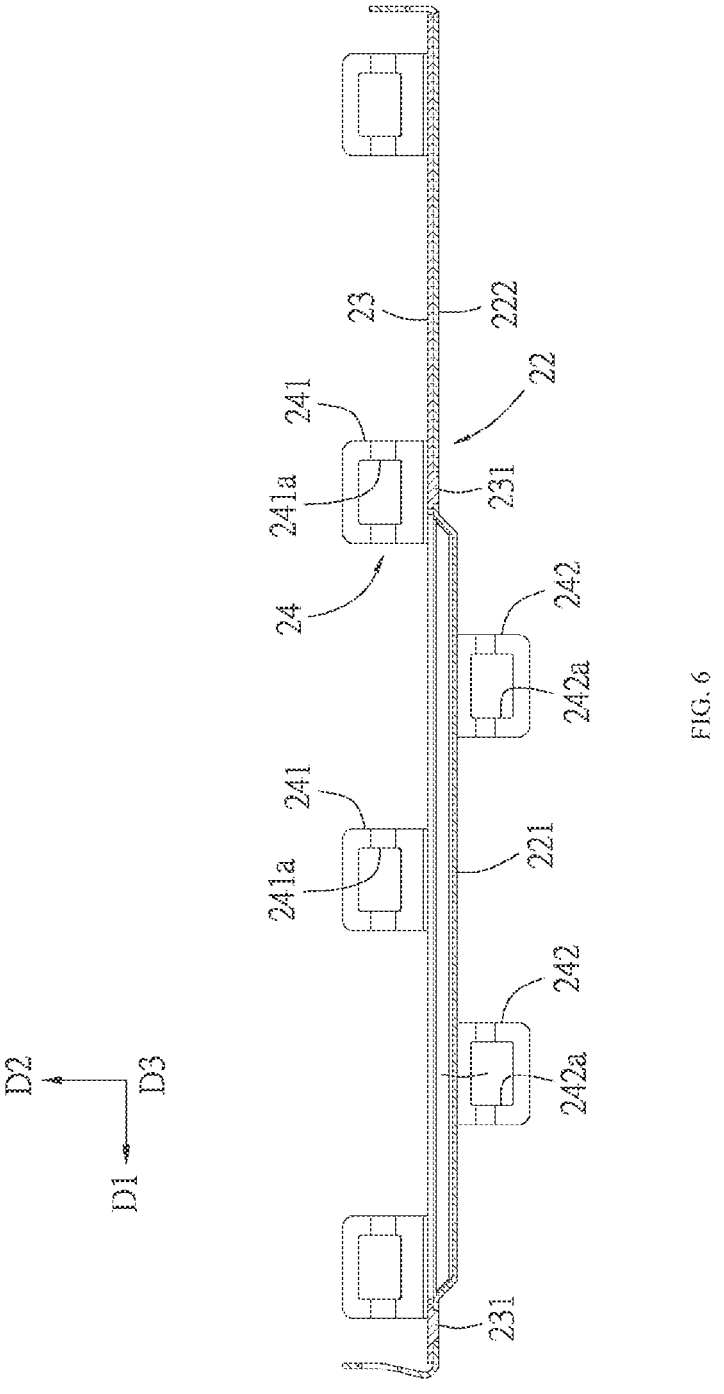
FIG. 6 is a cross sectional view of the thermal coupling cover and the sealing pad of the liquid cooling cabin of the first embodiment.
Figure 7:
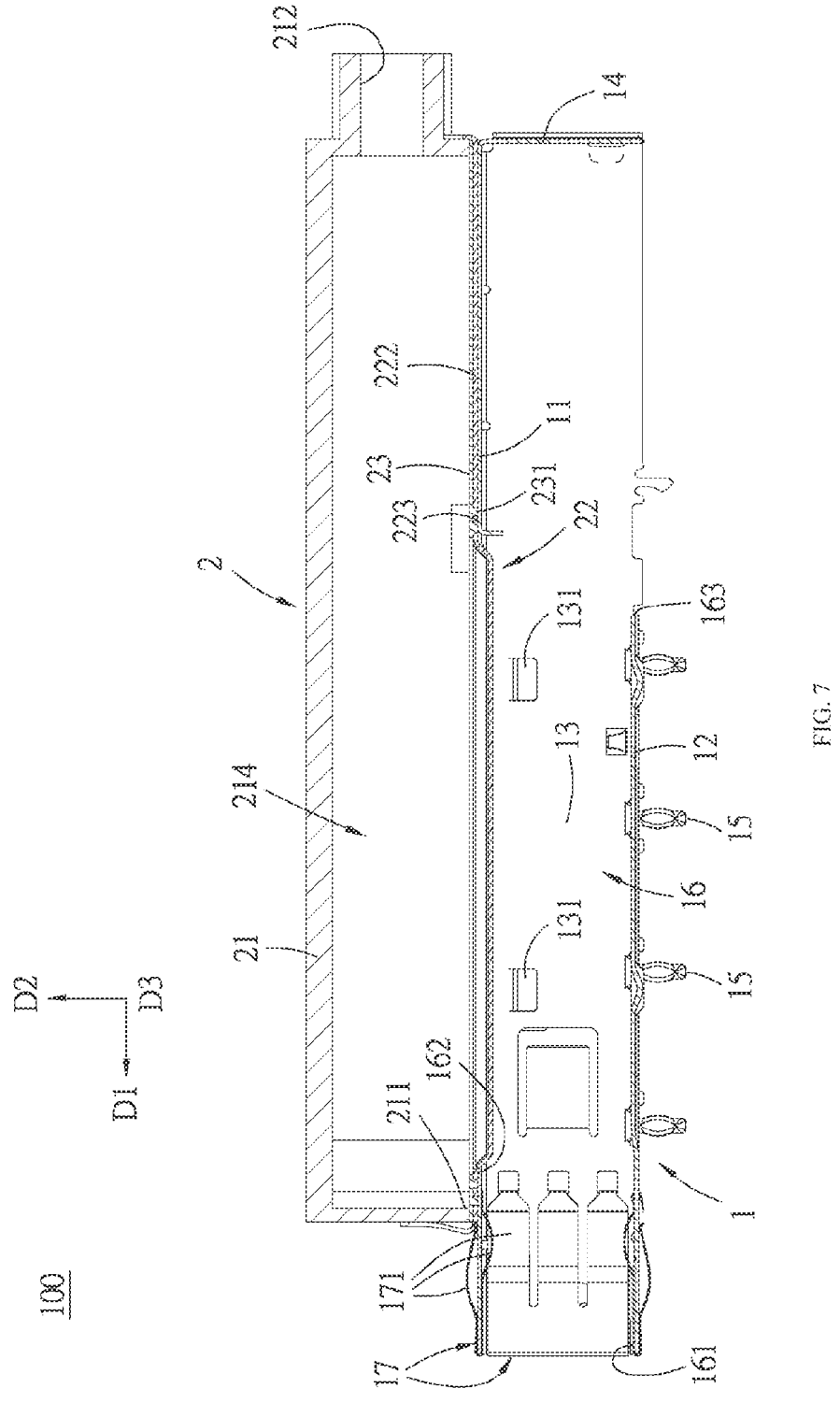
FIG. 7 is a cross sectional view of the first embodiment.

In the first embodiment, the thermal coupling cover 22 is made of a metal plate and, for example, is manufactured by stamping, the thermal coupling cover 22 has a thermal coupling plate 221 protruding and entering into the insertion space 16 via the window 162 of the shielding cage 1 and a mounting frame 222 surrounding the thermal coupling plate 221 and provided at the opening 211 of the shell 21 in sealing. The elastic sealing unit has an elastic component making that the thermal coupling plate 221 can elastically move and restore and a sealing component provided between the thermal coupling cover 22 and the shell 21 in sealing. In the first embodiment, the elastic component is a plurality of elastic connection pieces 223 which are integrally connected between the thermal coupling plate 221 and the mounting frame 222, the sealing component is a sealing pad 23 provided to an inner surface of the thermal coupling cover 22 and having a sheet shape, the sealing pad 23 seals a gap between the plurality of elastic connection pieces 223 which are between thermal coupling plate 221 and the mounting frame 222, and seals between the mounting frame 222 of the thermal coupling cover 22 and the opening 211 of the shell 21. In the first embodiment, the sealing pad 23 may be made of a rubber polymer material having electromagnetic shielding function, for example has a rubber polymer material which is conductive or contains a conductive material, and the sealing pad 23 may be integrally molded (may be integral insert molding or integral overmolding) to be provided on a whole inner side surface of the thermal coupling cover 22, as shown in FIG. 5, the sealing pad 23 may formed with protrusion portions 231 which insert into and fill between the plurality of elastic connection pieces 223 after the sealing pad 23 is molded, and the sealing pad 23 preferably is a flexible material, which will not hinder the elastic function of the plurality of elastic connection pieces 223. The thermal coupling plate 221 can elastically move and restore by a function of the plurality of elastic connection pieces 223 (the elastic component), specifically, in the first embodiment, the liquid cooling cabin 2 is relatively fixedly mounted on the shielding cage 1, that is, the shell 21 of the liquid cooling cabin 2 is fixed, when the pluggable module 300 (see FIG. 1) is inserted into the insertion space 16 of the shielding cage 1, the thermal coupling plate 221 is subject to the pushing of the pluggable module 300 to elastically move upwardly toward a direction close to the shell 21 along the up-down direction D2 (toward the inside of the liquid cooling cabin 2), when the pluggable module 300 is pulled out from the insertion space 16 of the shielding cage 1, the thermal coupling plate 221 elastically restores downwardly toward a direction away from the shell 21 along the up-down direction D2 (toward the outside of the liquid cooling cabin 2). The function of the plurality of elastic connection pieces 223 (the elastic component) can provide more effective contact pressure between the thermal coupling plate 221 and pluggable module 300 and the elastic restore capability of the thermal coupling plate 221, and by that the thermal coupling plate 221 which can elastically move directly contacts the heat source and the cooling liquid, heat dissipation efficiency of the liquid cooling cabin 2 is enhanced. In addition, by the thermal coupling cover 22, the thermal coupling plate 221 which protrudes, the mounting frame 222, and the plurality of elastic connection pieces 223 integrally connected between the thermal coupling plate 221 and the mounting frame 222, which are made of a metal plate, manufacturing cost can be reduced and manufacturing difficulty can be reduced.

Figure 3:
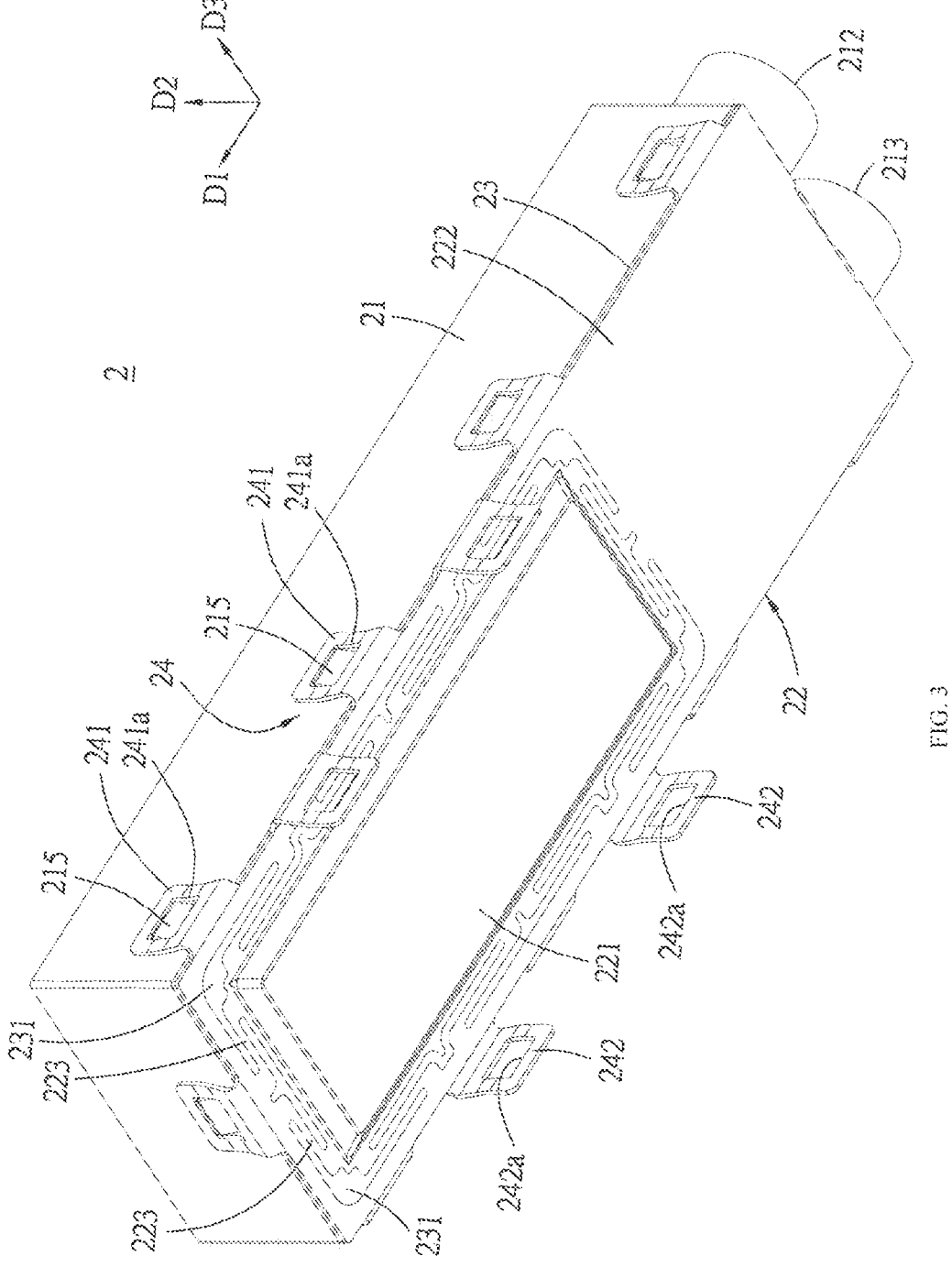
FIG. 3 is a perspective view of a liquid cooling cabin of the first embodiment viewed from bottom.
Figure 4:
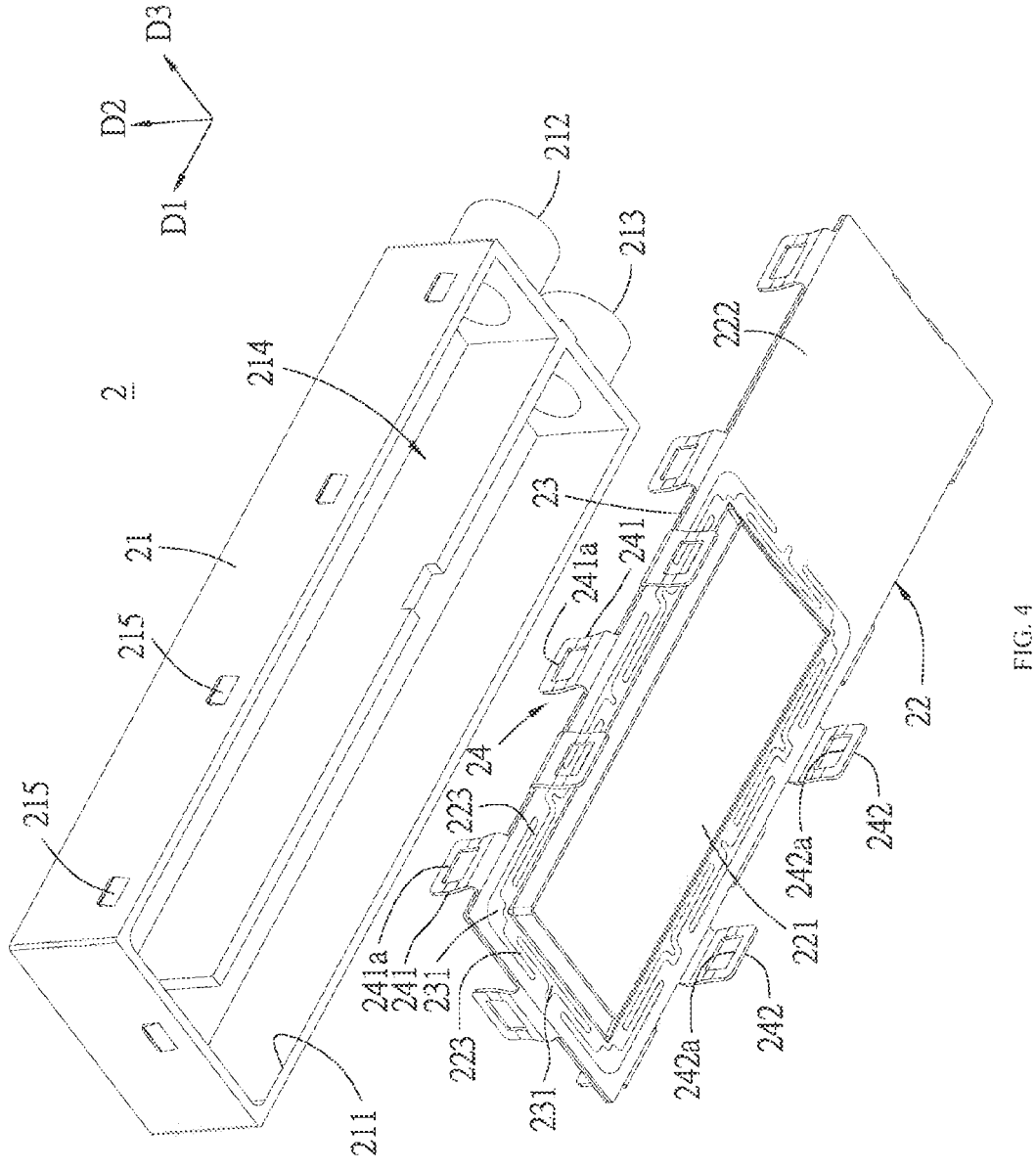
FIG. 4 is a perspective exploded view of FIG. 3.

Referring to FIG. 2 to FIG. 4, the liquid cooling cabin 2 further comprises a latching member 24, the liquid cooling cabin 2 is fixedly on the top wall 11 of the shielding cage 1 by latching of the latching member 24, that is, the liquid cooling cabin 2 is relatively fixed and static with respect to the shielding cage 1. In the first embodiment, the latching member 24 is configured integrally from an edge of the thermal coupling cover 22, and the latching member 24 latches to the shell 21 of the liquid cooling cabin 2 and the shielding cage 1. The shell 21 is formed with a plurality of latching blocks 215 protruding outwardly, each side wall 13 of the shielding cage 1 is formed with a plurality of latching pieces 131 protruding outwardly, the latching member 24 has a plurality of first latching portions 241 which extend upwardly from the edge of the thermal coupling cover 22 and latch to the shell 2 respectively and a plurality of second latching portions 242 which extend downwardly from the edge of the thermal coupling cover 22 and latch to the two side walls 13 of the shielding cage 1. Each first latching portion 241 is formed with a first latching hole 241a correspondingly latching with the latching block 215 of the shell 21, each second latching portion 242 is formed with a second latching hole 242a correspondingly latching with the latching piece 131 of the shielding cage 1. In other varied embodiments, the liquid cooling cabin 2 may be fixed on a rack of a device, so that the liquid cooling cabin 2 is relatively fixed on the shielding cage 1.

Figure 8:
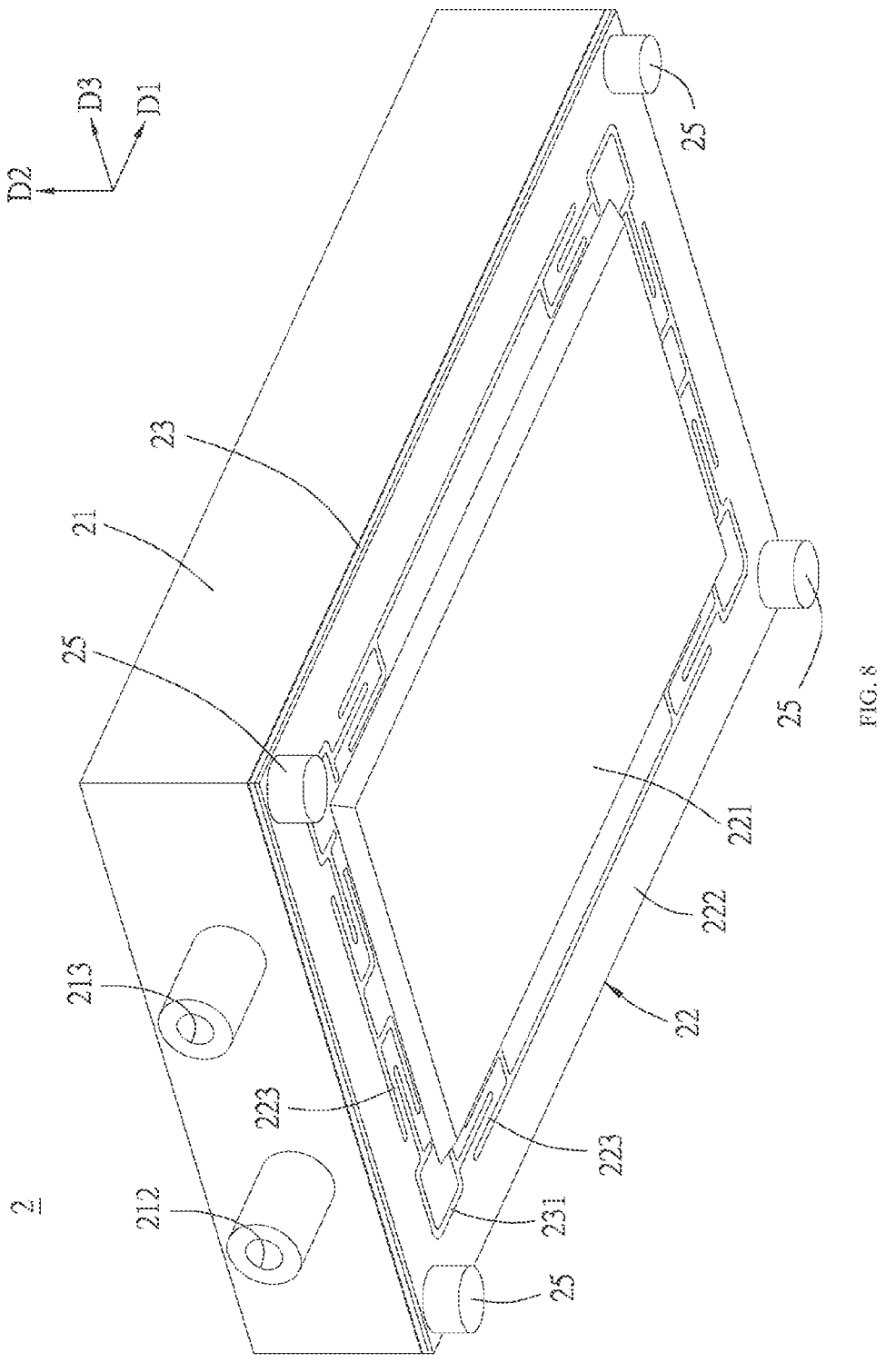
FIG. 8 is a perspective view of a liquid cooling cabin of a second embodiment of the connector assembly of the present disclosure.
Figure 9:
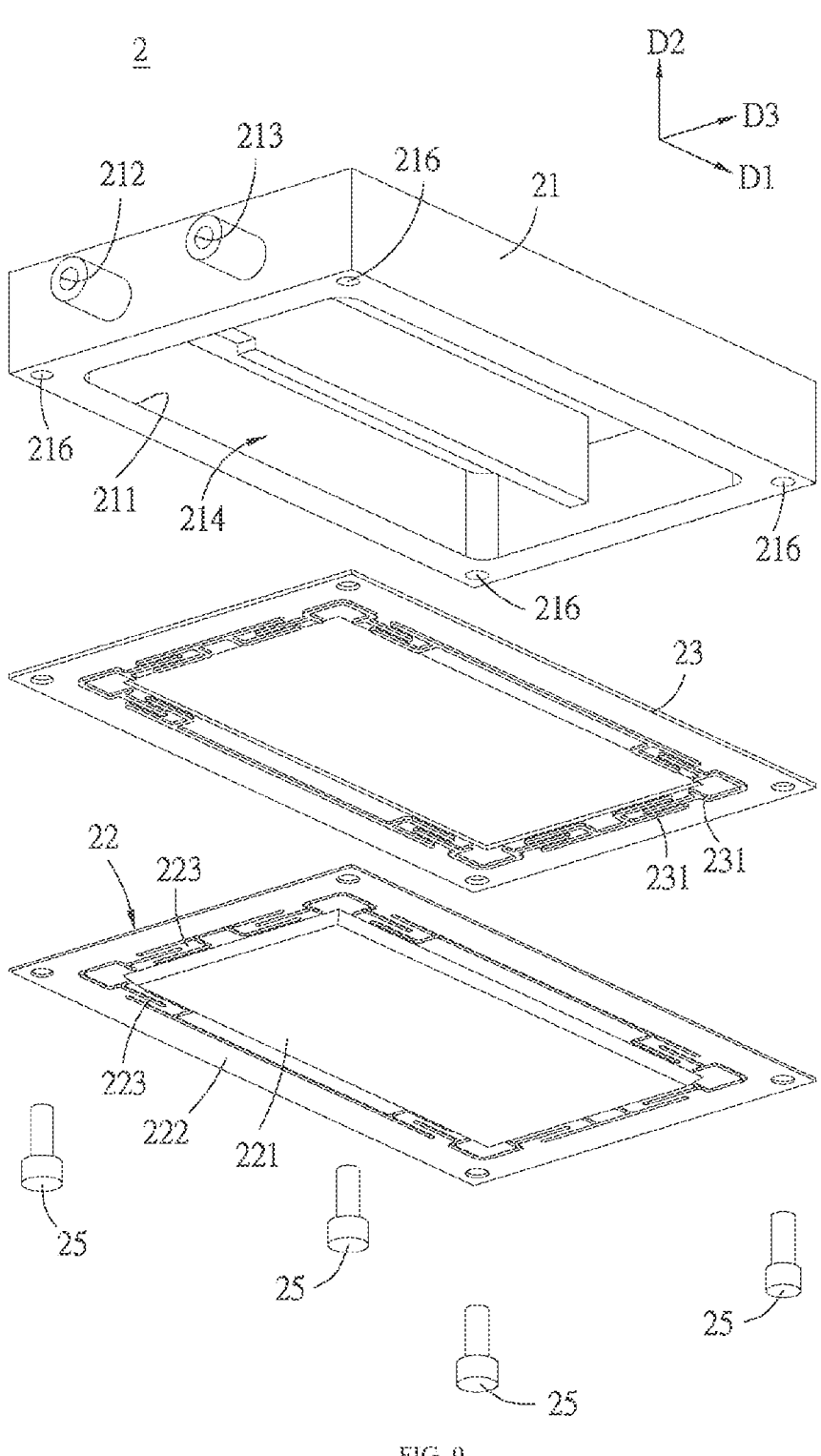
FIG. 9 is a perspective exploded view of FIG. 8.

Referring to FIG. 8 and FIG. 9, a difference of a second embodiment of the connector assembly of the present disclosure from the first embodiment lies in that, the shell 21 of the liquid cooling cabin 2 is formed with a plurality of threaded holes 216 on a periphery of the opening 211, the liquid cooling cabin 2 further comprises a plurality of threaded members 25, the plurality of threaded member 25 pass through the thermal coupling cover 22 and the sealing pad 23 and respectively screw into the plurality of threaded hole 216, the thermal coupling cover 22 and the sealing pad 23 are provided to the opening 211 of the shell 21 in sealing with the plurality of threaded members 25.

Figure 10:
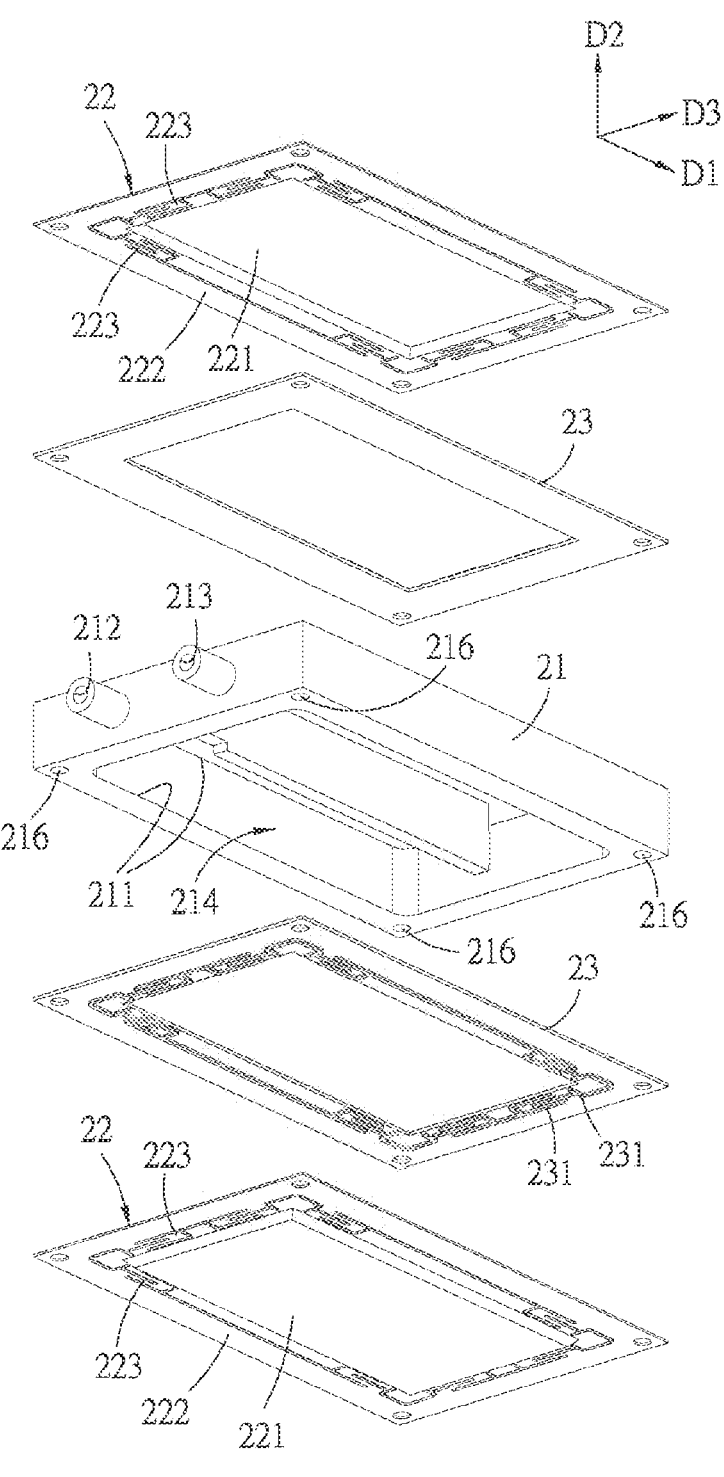
FIG. 10 is a perspective exploded view of a liquid cooling cabin of a third embodiment of the connector assembly of the present disclosure.
Figure 11:
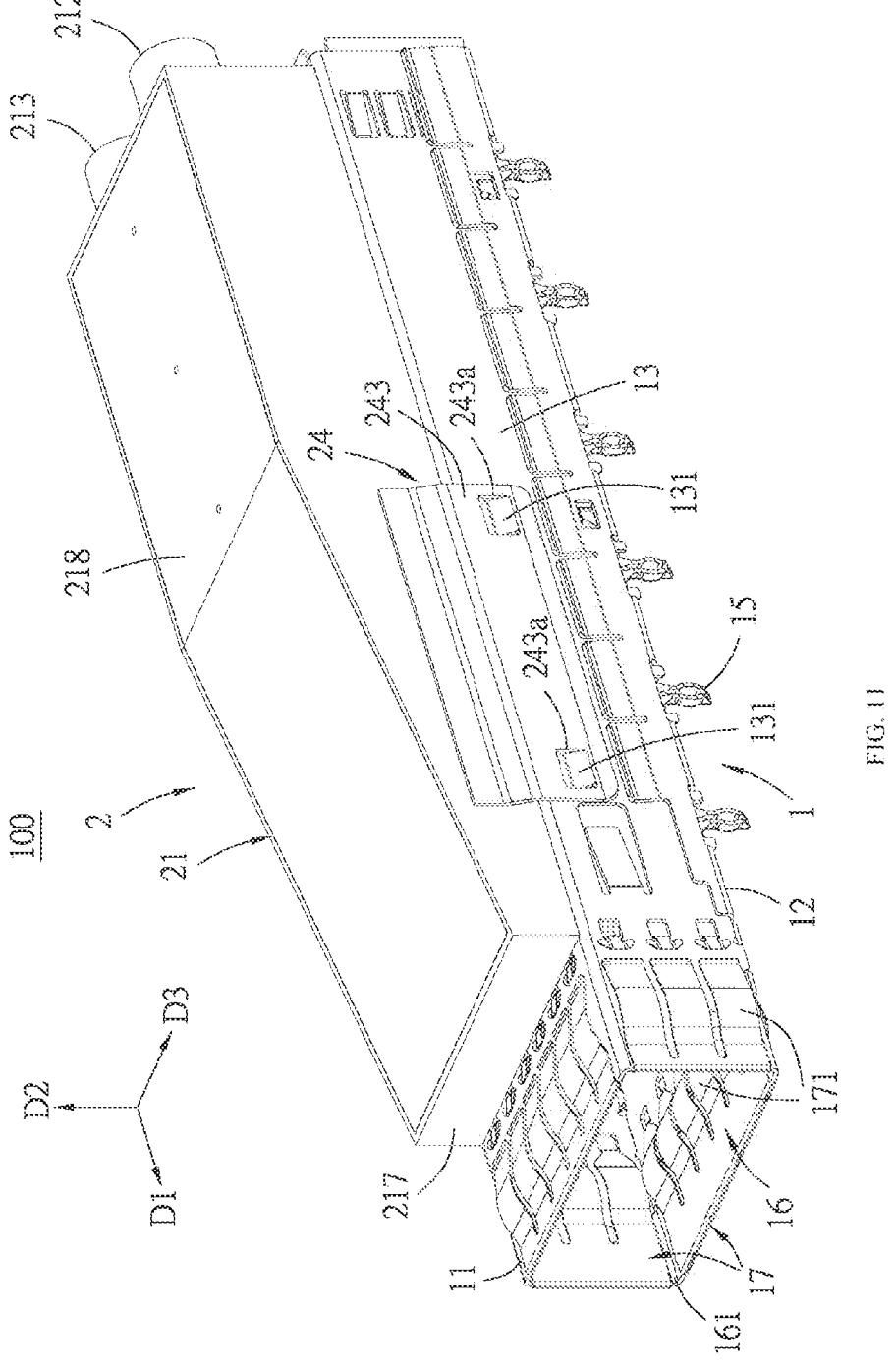
FIG. 11 is a perspective view of a fourth embodiment of the connector assembly of the present disclosure.
Figure 12:
FIG. 12 is a perspective exploded view of FIG. 11.
Figure 13:
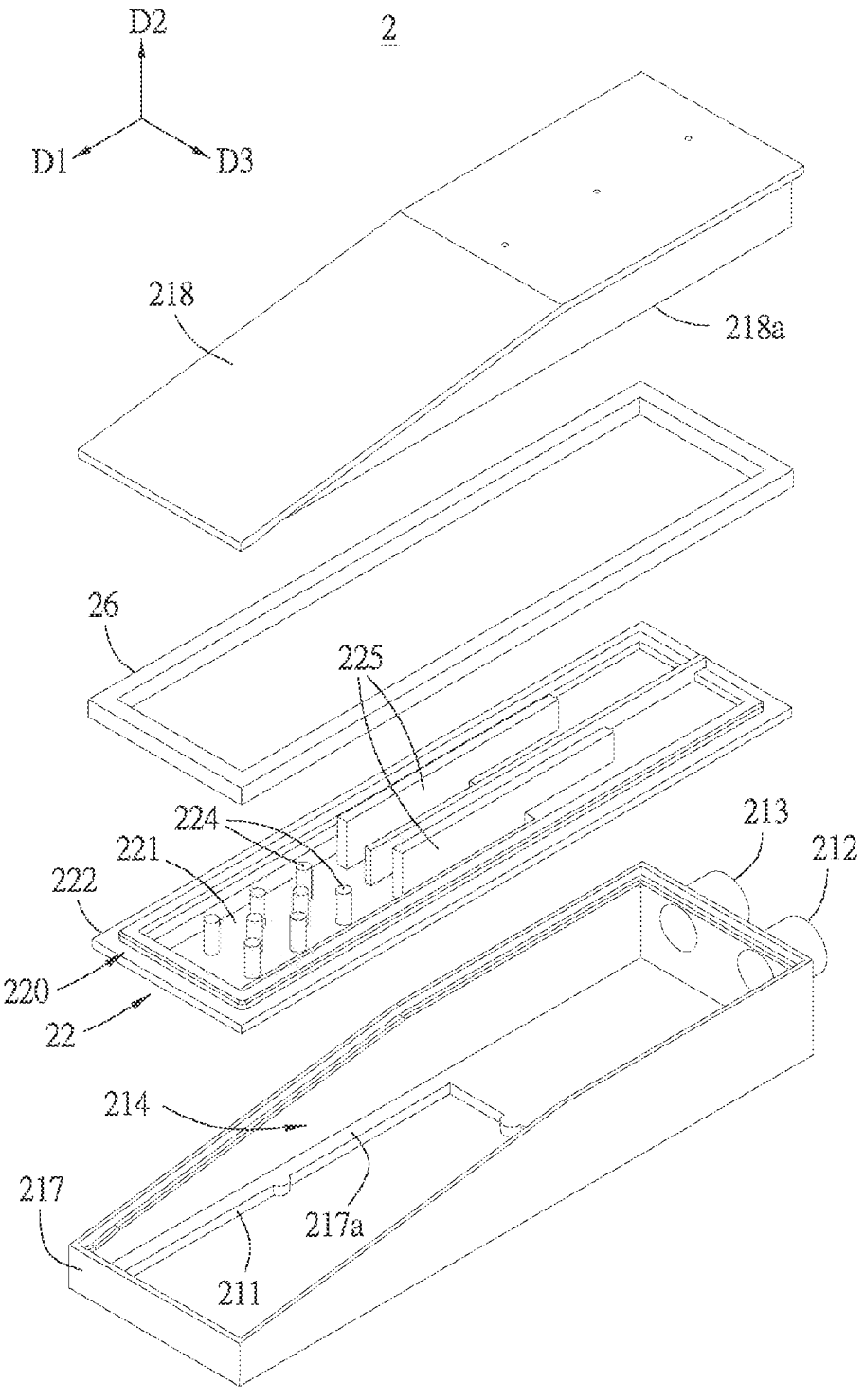
FIG. 13 is a perspective exploded view of a liquid cooling cabin of the fourth embodiment.
Figure 14:
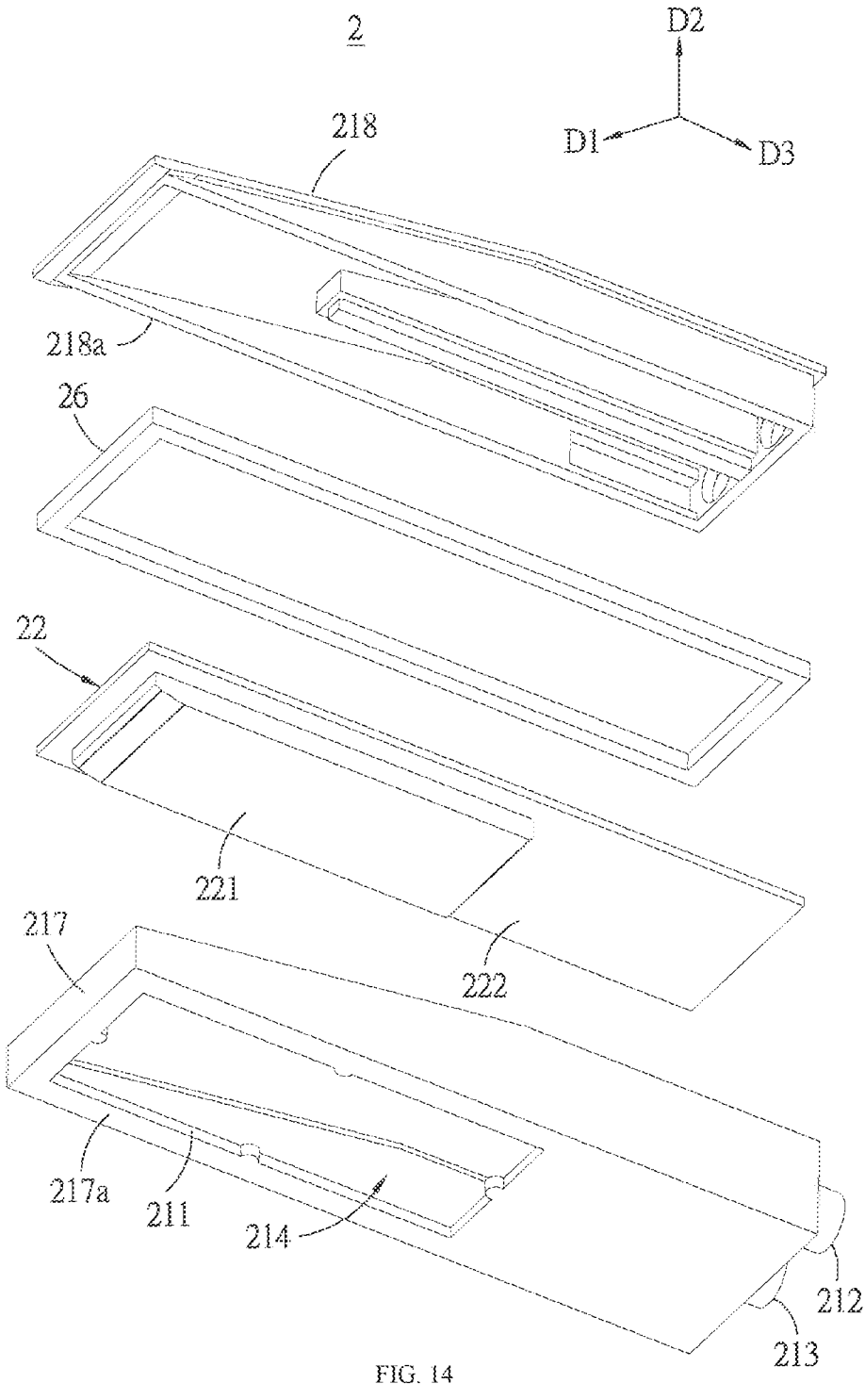
FIG. 14 is a perspective exploded view of FIG. 13 viewed from another angle.
Figure 15:
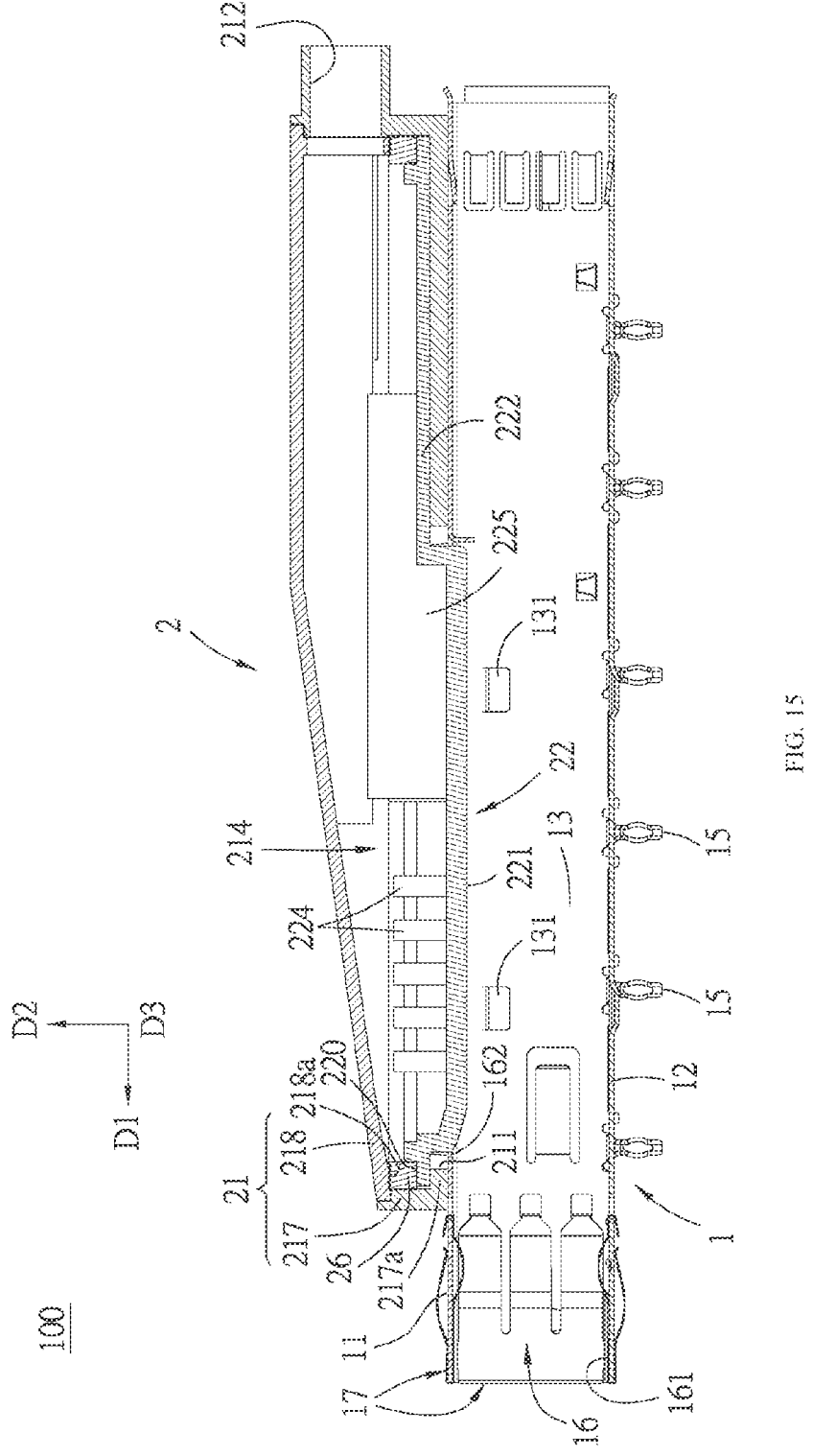
FIG. 15 is a cross sectional view of the fourth embodiment.
Figure 16:
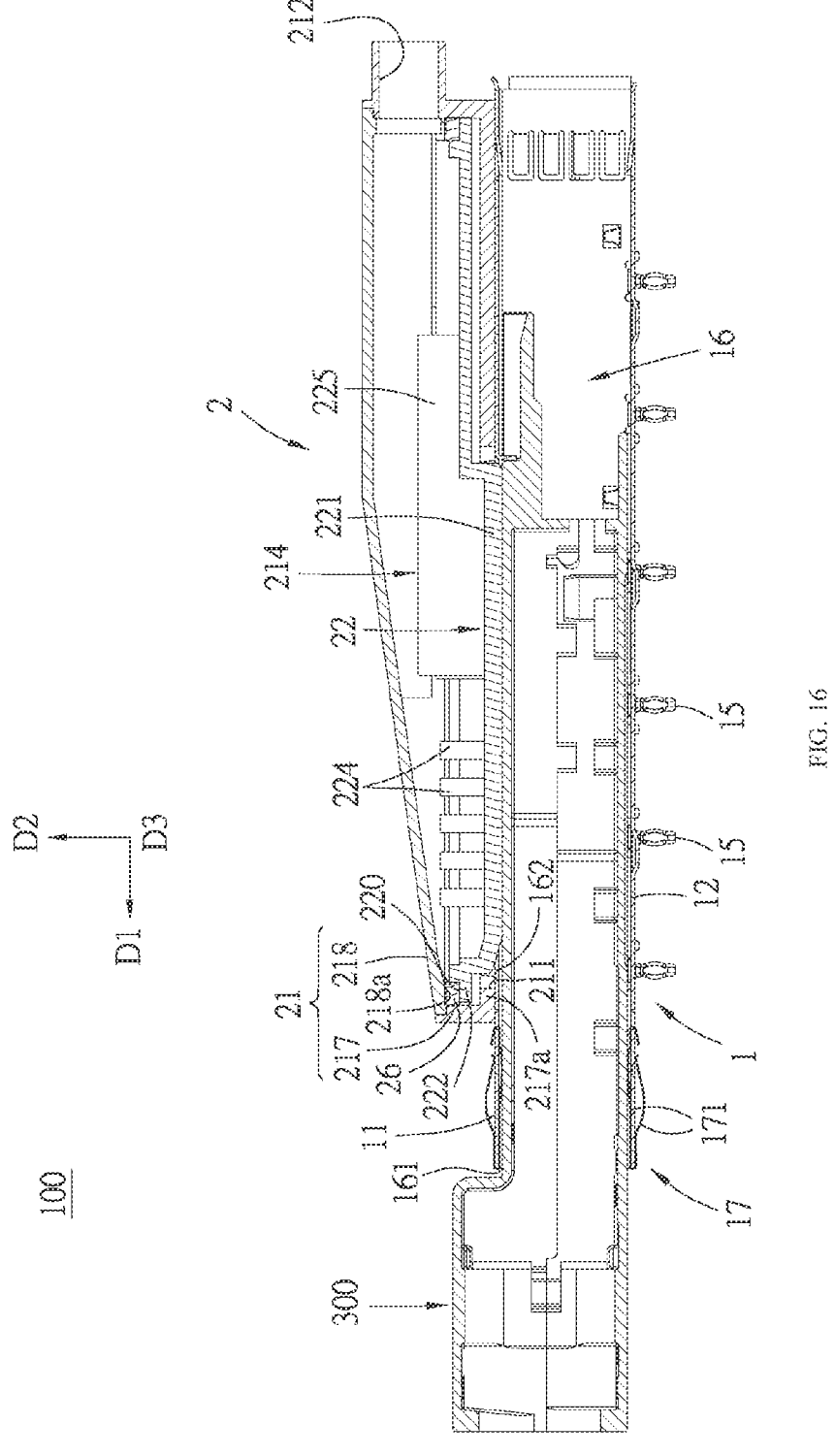
FIG. 16 is a cross sectional view illustrating that the pluggable module is inserted into the fourth embodiment.
Figure 17:
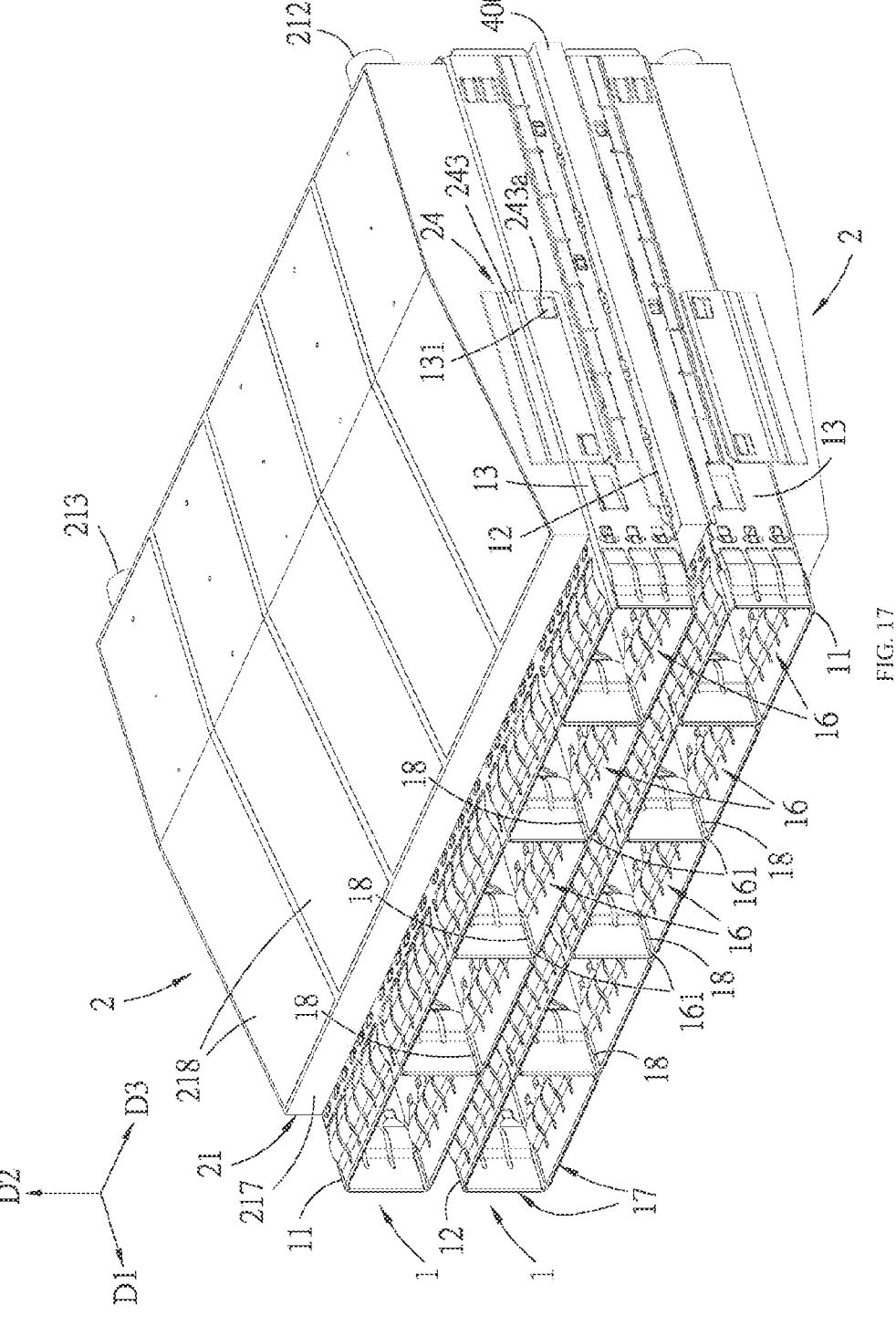
FIG. 17 is a perspective view of a liquid cooling cabin of a fifth embodiment of the connector assembly of the present disclosure.
Figure 18:
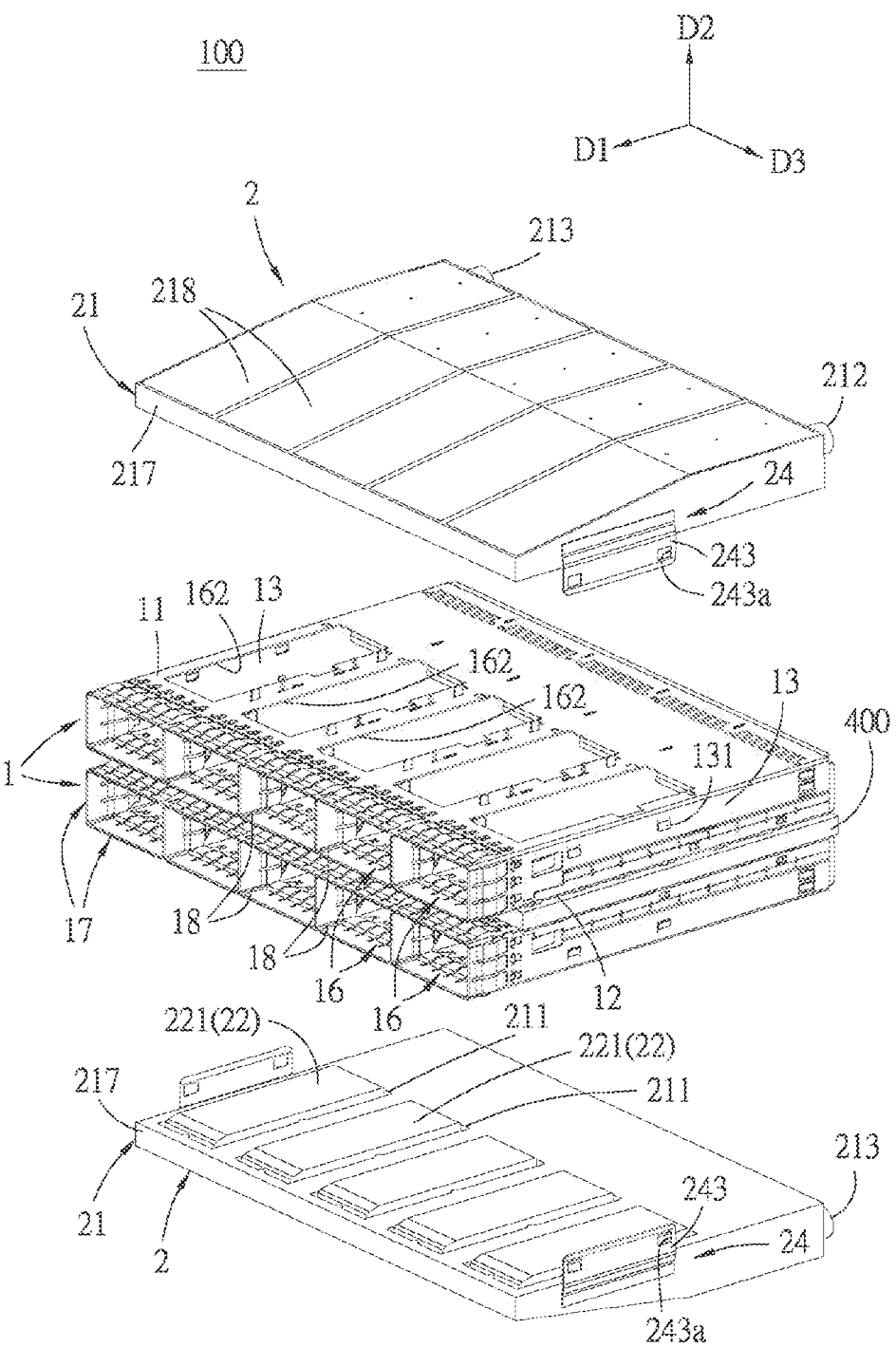
FIG. 18 is a perspective exploded view of FIG. 17.
Figure 19:
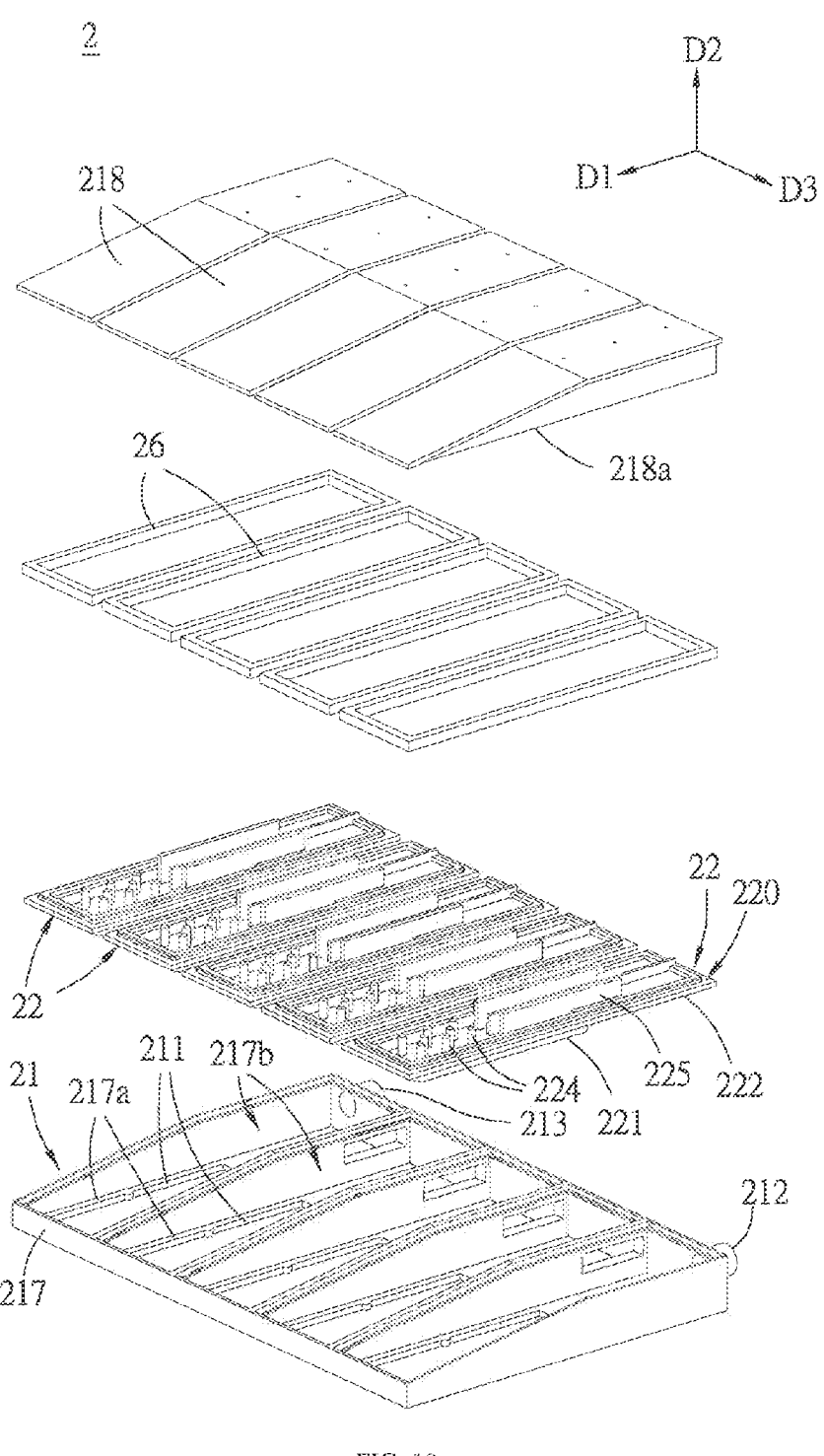
FIG. 19 is a perspective exploded view of the liquid cooling cabin of the fifth embodiment.
Figure 20:
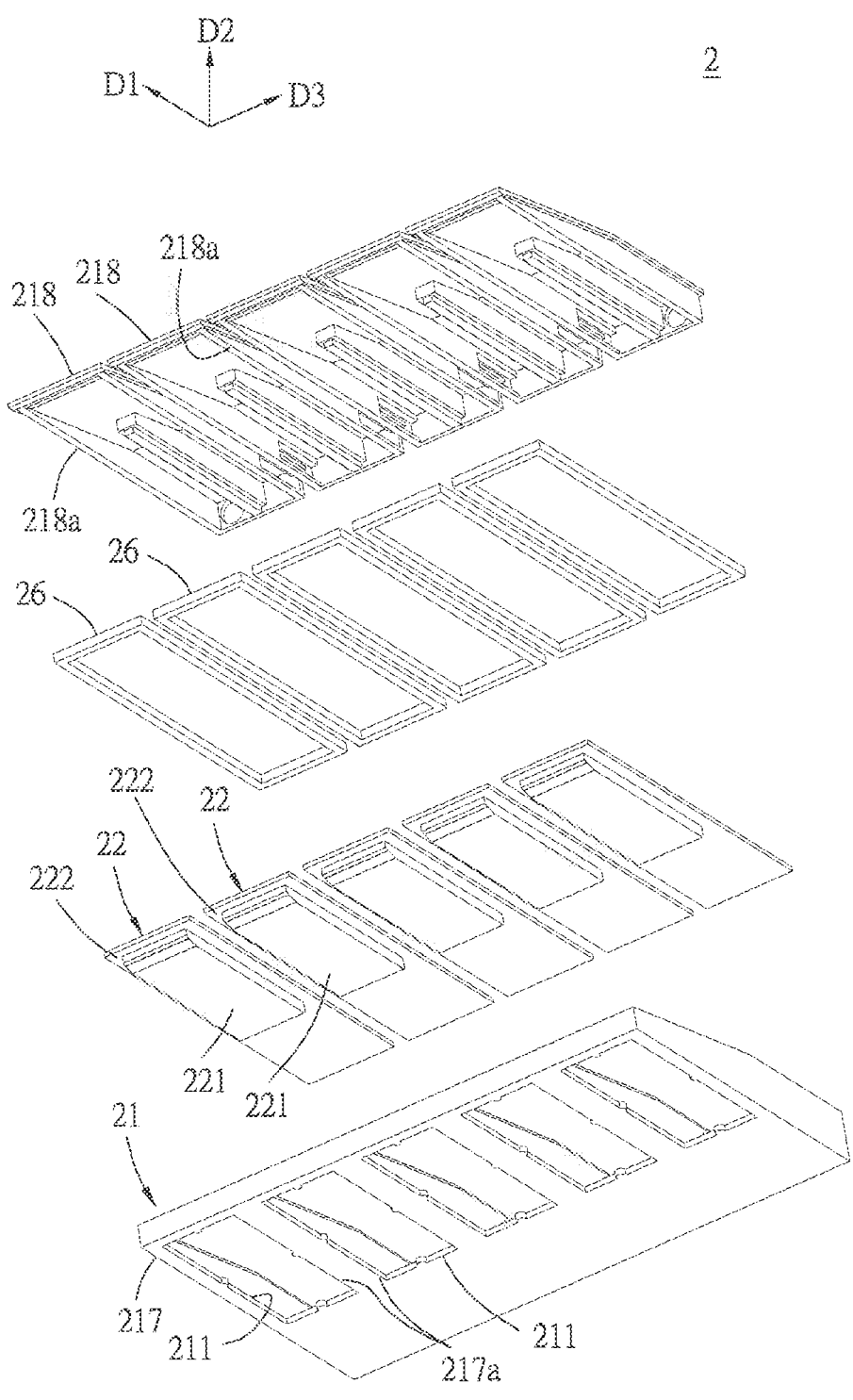
FIG. 20 is a perspective exploded view of FIG. 19 viewed from another angle.
Figure 21:
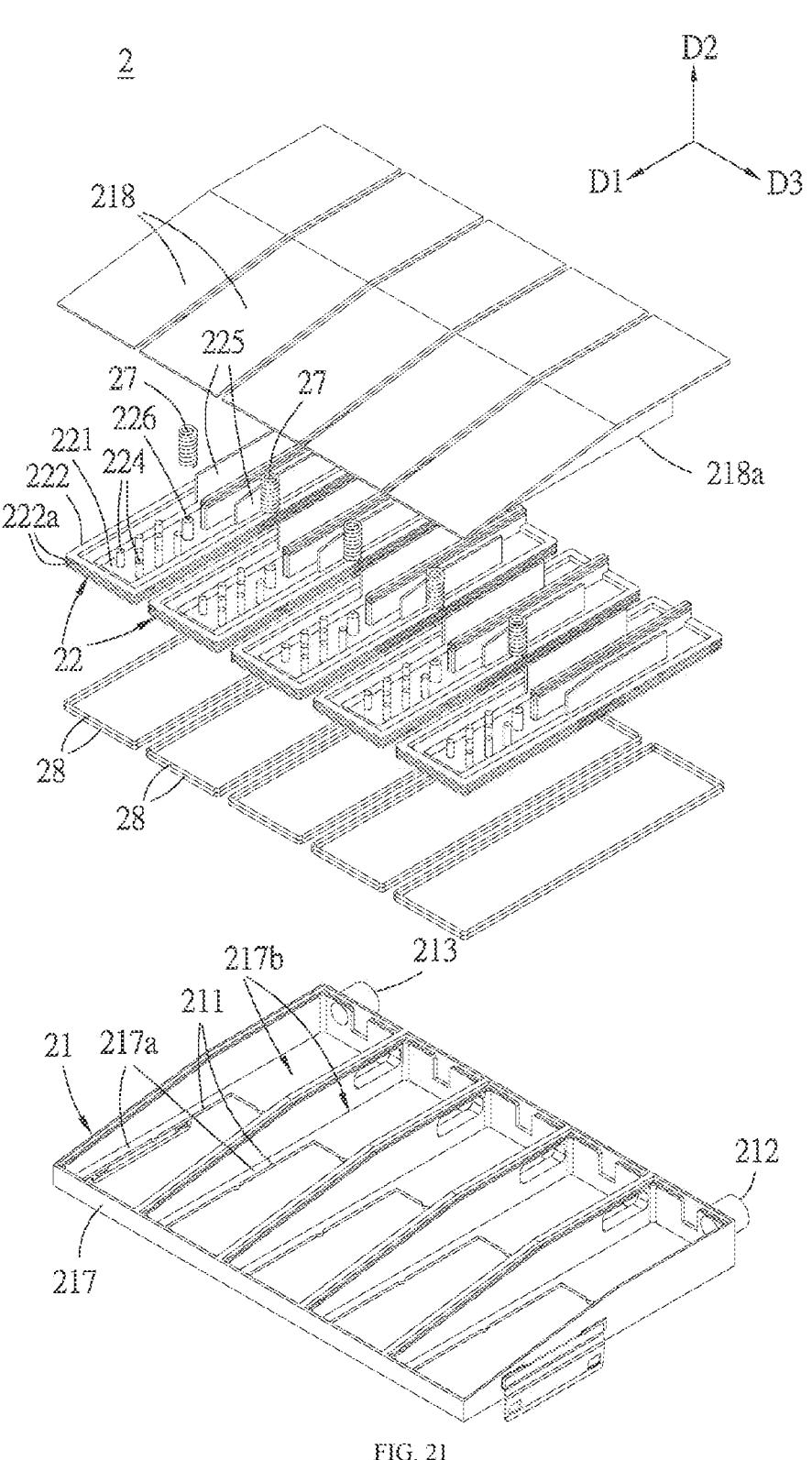
FIG. 21 is a perspective exploded view of a liquid cooling cabin of a sixth embodiment of the connector assembly of the present disclosure.
Figure 22:
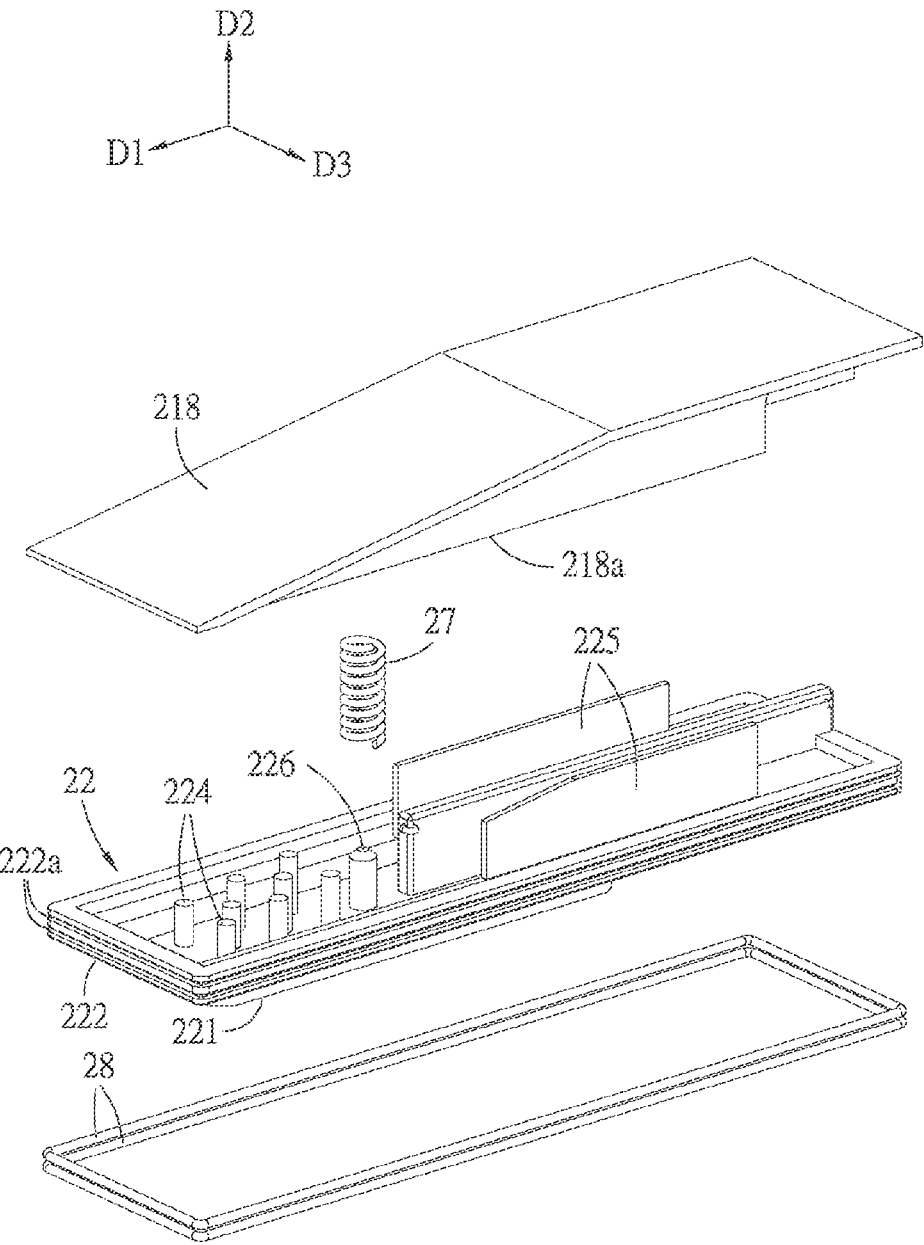
FIG. 22 is a perspective exploded view of the liquid cooling cabin of the sixth embodiment, with a main frame of the liquid cooling cabin omitted.
Figure 23:
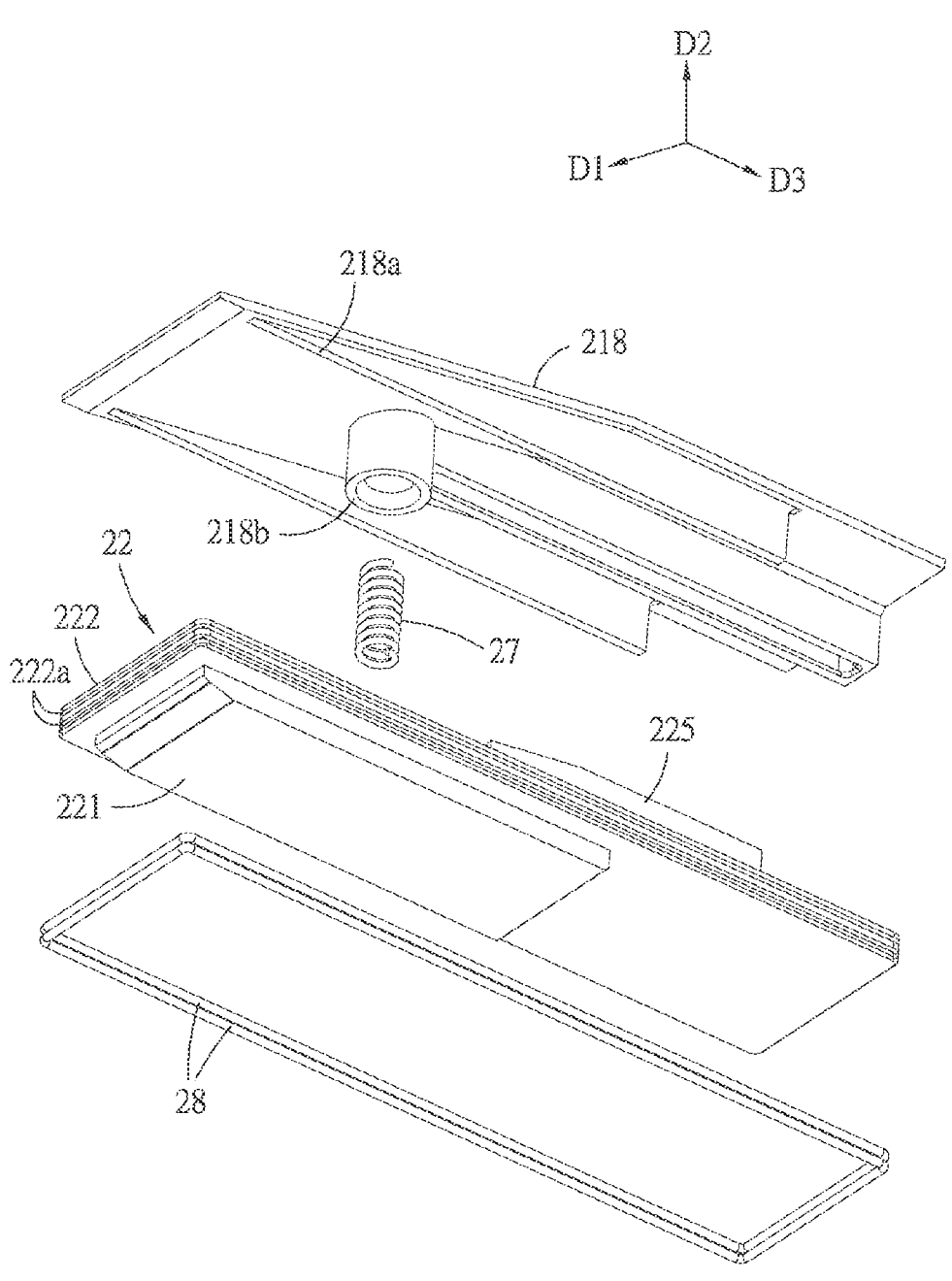
FIG. 23 is a perspective exploded view of FIG. 22 viewed from another angle.
Figure 24:
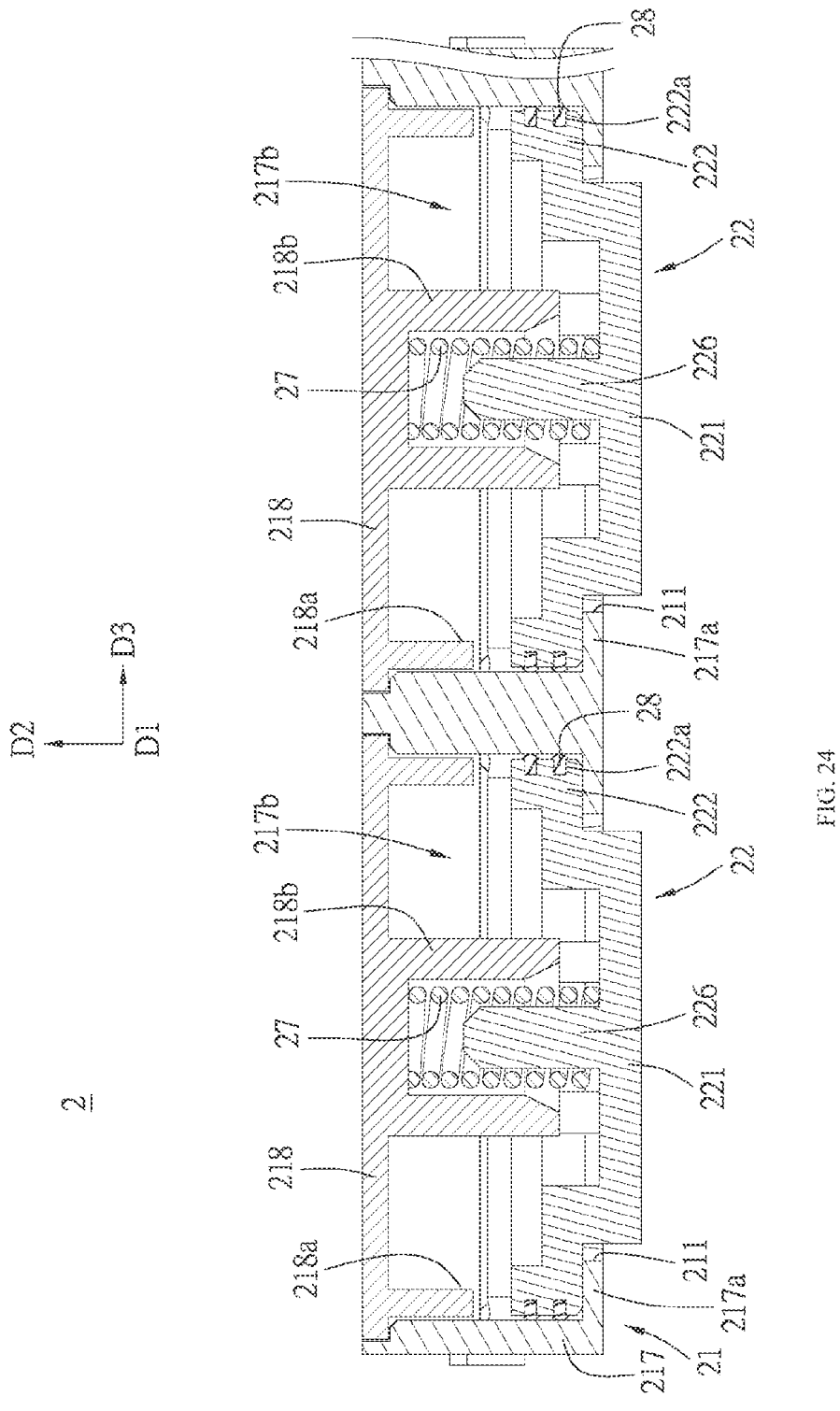
FIG. 24 is a cross sectional view of the liquid cooling cabin of the sixth embodiment.
Figure 25:
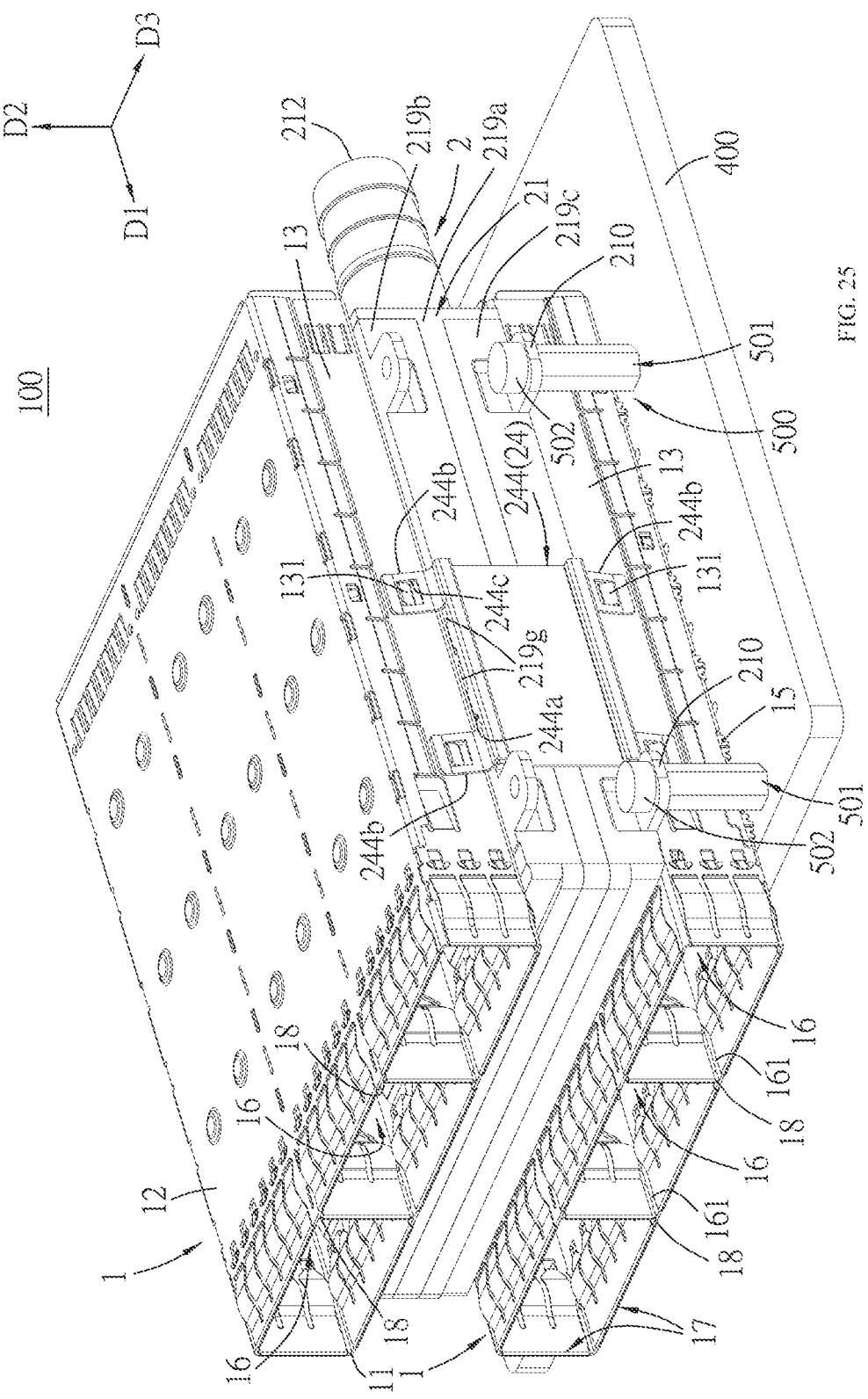
FIG. 25 is a perspective view of a seventh embodiment of the connector assembly of the present disclosure.
Figure 26:
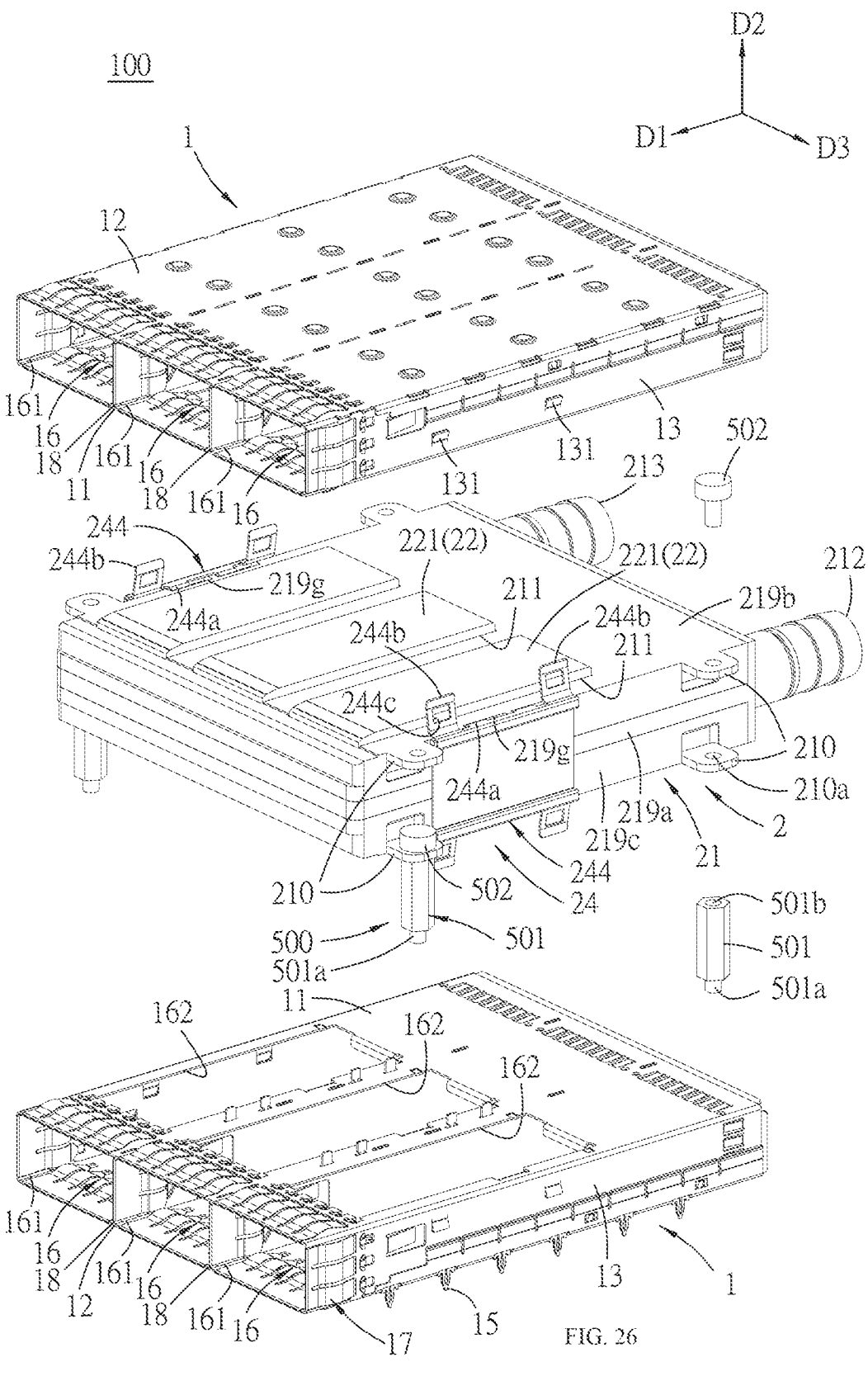
FIG. 26 is a perspective exploded view of the seventh embodiment.
Figure 27:
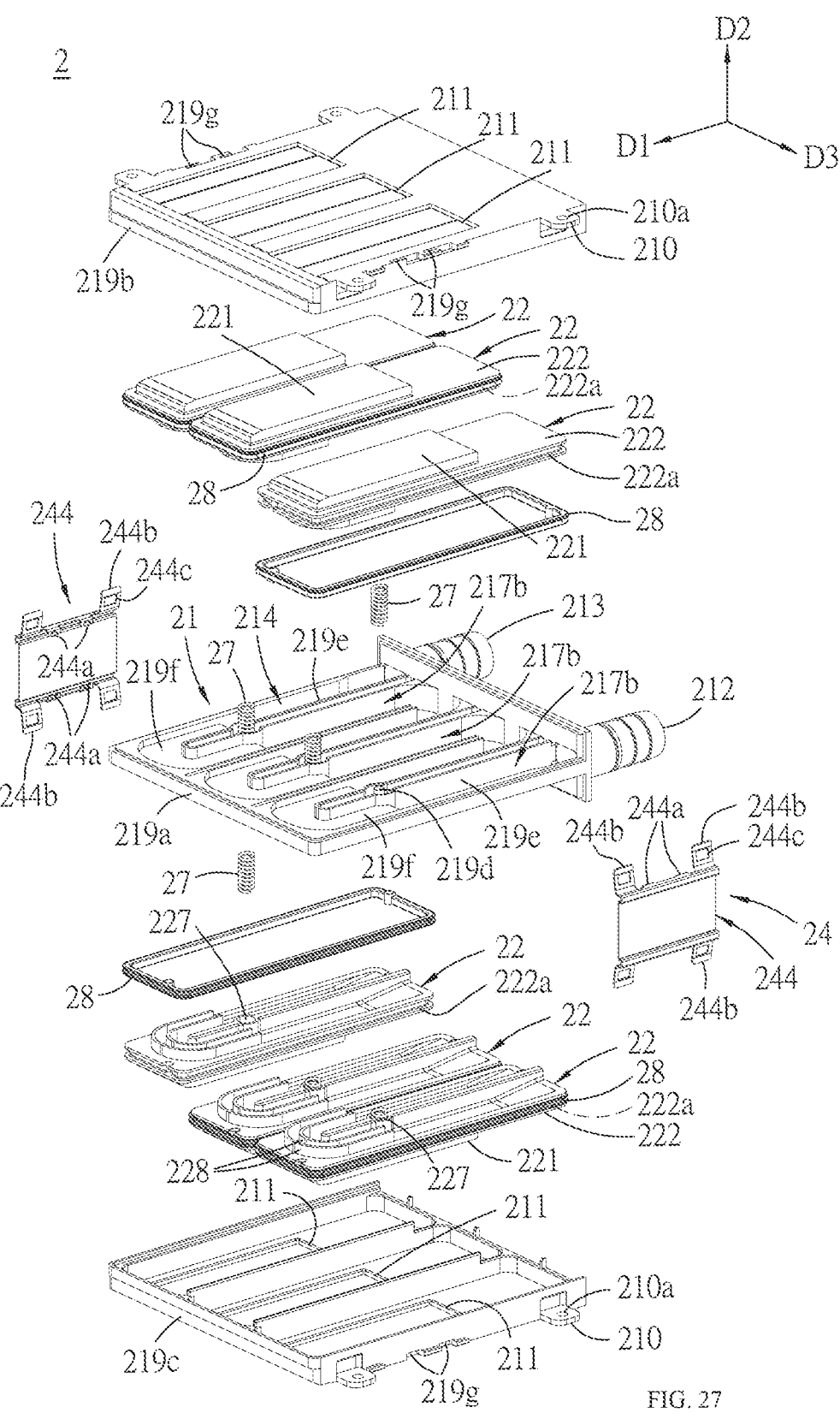
FIG. 27 is a perspective exploded view of the seventh embodiment of liquid cooling cabin.
Figure 28:
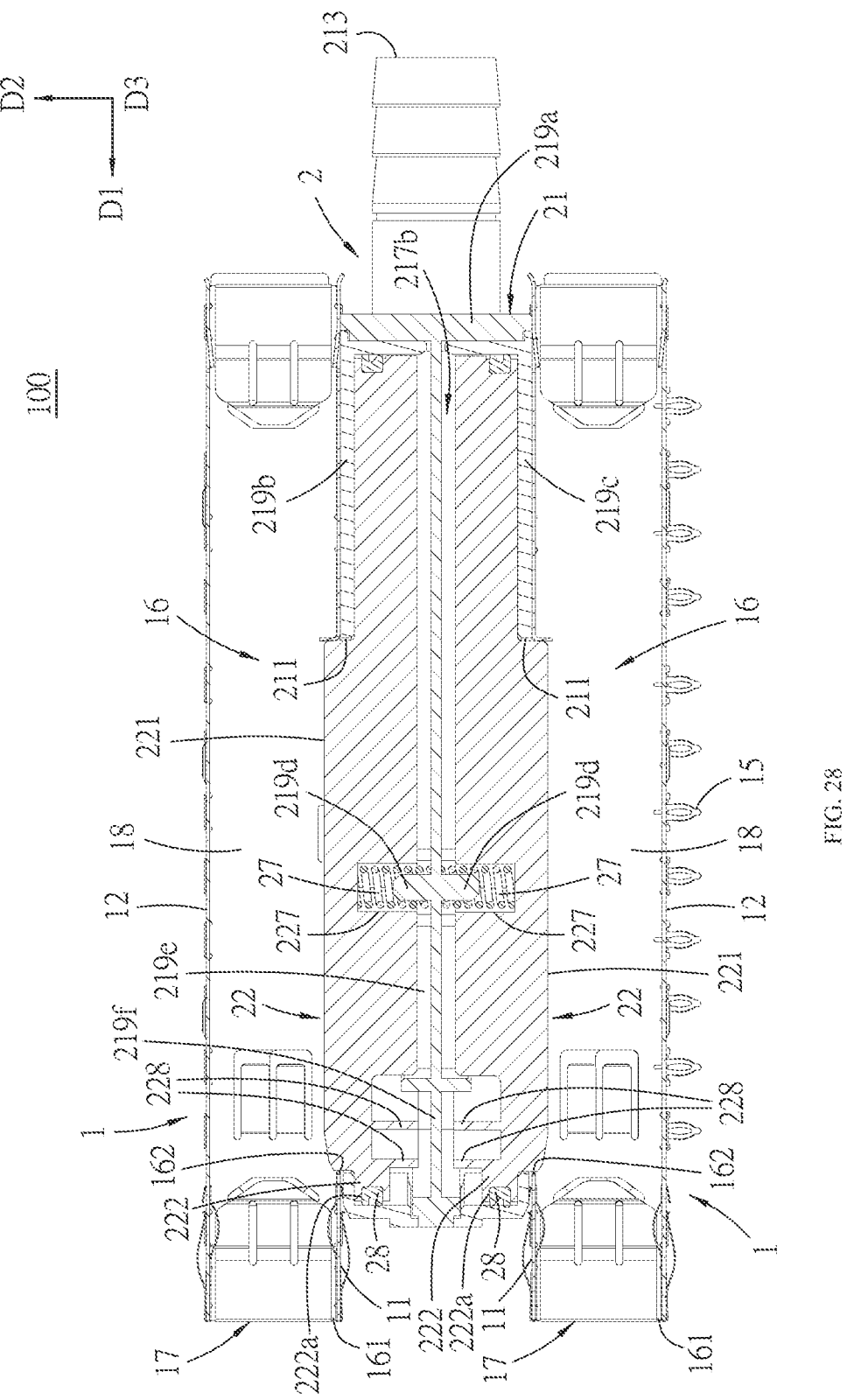
FIG. 28 is a cross sectional view of the seventh embodiment.

Referring to FIG. 10, a difference of a third embodiment of the connector assembly of the present disclosure from the first embodiment lies in that, the shell 21 of the liquid cooling cabin 2 further has another opening 211 positioned at top thereof, and the liquid cooling cabin 2 further comprises another thermal coupling cover 22 provided at the another opening 211 of the shell 21 in sealing and another sealing pad 23 sealing between the mounting frame 222 of the another thermal coupling cover 22 and the shell 21. It is noted that, in the third embodiment, the liquid cooling cabin 2 can be applied to between the two insertion spaces 16 of the shielding cage 1, the thermal coupling plates 221 of the two thermal coupling covers 22 of the liquid cooling cabin 2 respectively insert into the two insertion spaces 16 to cooperatively dissipate heat.

Referring to FIG. 11 to FIG. 16, a difference of a fourth embodiment of the connector assembly 100 of the present disclosure from the first embodiment lies in that, the elastic sealing unit has an elastic sealing component which makes that the thermal coupling plate 221 can elastically move and restore and which is provided between the thermal coupling cover 22 and the shell 21 in sealing, the elastic sealing component is a single elastic sealing gasket 26, in addition to be used to seal between the thermal coupling cover 22 and the shell 21, meanwhile the elastic sealing component provides an elastic force to make that the whole the thermal coupling cover 22 together with the thermal coupling plate 221 can elastically move upwardly toward a direction close to the shell 21 and elastically restore downwardly toward a direction away from the shell 21. In the fourth embodiment, the thermal coupling plate 221 integrally protrudes from a bottom surface of the thermal coupling cover 22, the mounting frame 222 surrounds the thermal coupling plate 221 and is integrally connected to the thermal coupling plate 221, and an annular recessed channel 220 facing the shell 21 is formed at an edge of the mounting frame 222, the elastic sealing gasket 26 is correspondingly provided to the annular recessed channel 220 of the mounting frame 222 and interposed between the annular recessed channel 220 of the mounting frame 222 of the thermal coupling cover 22 and the shell 21 in sealing. It is noted that, although in the fourth embodiment, a cross section of a wall surface of the annular recessed channel 220 defined by the mounting frame 222 is generally L-shaped, the cross section of the wall surface also may be U-shaped or other suitable shape, but is not limited thereto. The shell 21 has a main frame 217 which is formed with an opening 211 at a bottom of the main frame 217 and an upper cover 218 which covers above the main frame 217. The main frame 217 of the shell 21 has a supporting edge portion 217a defining the opening 211, the upper cover 218 of the shell 21 has a pressing edge portion 218a positioned at a lower edge of the upper cover 218 and positioned above the supporting edge portion 217a. The edge of the mounting frame 222 of thermal coupling cover 22 is positioned between the supporting edge portion 217a and the pressing edge portion 218a and is supported on the supporting edge portion 217a, the elastic sealing gasket 26 is interposed between the annular recessed channel 220 of the mounting frame 222 of the thermal coupling cover 22 and the pressing edge portion 218a in elastic pre-compression. The elastic sealing gasket 26 can seal a gap between the thermal coupling cover 22 and the shell 21, meanwhile the elastic function of the elastic sealing gasket 26 makes that the whole thermal coupling cover 22 can relatively elastically move toward the shell 21 and elastically restore toward an opposite direction. It is noted that, in other varied embodiments, the shell 21 may be not divided into the main frame 217 and the upper cover 218 but is configured as one-piece. In addition, the thermal coupling cover 22 in the embodiment, for example, is formed by cast molding, and the thermal coupling cover 22 further has a plurality of posts 224 and a plurality of plates 225 which extend toward the inside of the shell 21, the plurality of posts 224 and the plurality of plates 225 may increase turbulent flow function and contact area of the cooling liquid, thereby making the cooling liquid more effective at removing heat and increasing heat dissipating performance.

Moreover, in the fourth embodiment, the latching members 24 are provided to two sides of the main frame 217 of the shell 21 in the left-right direction D3 by welding manner, in other embodiments, the latching member 24 also may be provided to the main frame 217 of the shell 21 by other assembling manner. The latching members 24 have two latching plates 243 respectively extending downwardly from the two sides of the main frame 217 and respectively latching to the two side walls 13 of the shielding cage 1, each latching plate 243 is formed with a plurality of latching holes 243a correspondingly latching with the latching pieces 131 of the side wall 13 of the shielding cage 1. Moreover, the elastic sealing gasket 26, for example, may be made of a rubber polymer material having elasticity, or may be further made of a rubber polymer material having electromagnetic shielding function, for example a rubber polymer material having conductivity or containing a conductive material, which makes that the elastic sealing gasket 26 has sealing performance, elasticity and electromagnetic shielding function at the same time.

Referring to FIG. 17 to FIG. 20, a difference of a fifth embodiment of the connector assembly 100 of the present disclosure from the fourth embodiment lies in that, the connector assembly 100 includes two shielding cages 1 which are arranged in the up-down direction D2 and respectively provided to a top surface and a bottom surface of a circuit board 400 and two liquid cooling cabins 2 which are respectively provided to the two shielding cages 1. Specifically, the two liquid cooling cabins 2 are respectively provided to an upper side of the shielding cage 1 positioned above and a lower side of the shielding cage 1 positioned below. Each shielding cage 1 has a plurality of partitioning walls 18 parallel to the two side walls 13 and arranged along the left-right direction D3, a plurality of insertion spaces 16 formed by partitioning of the plurality of partitioning walls 18, a plurality of inserting openings 161 positioned at the front end of the shielding cage 1, respectively in communication with the plurality of insertion spaces 16 and allowing the pluggable module 300 (see FIG. 1) to insert, and a window 162 formed to the top wall 11 and respectively communicating the plurality of insertion spaces 16. In the fifth embodiment, the window 162 is plurality in number, and the plurality of windows 162 are respectively correspondingly communication with the plurality of insertion spaces 16. But it is noted that, in a varied embodiment, the window 162 may be only one in number, in this varied embodiment, the window 162 is communication with the plurality of insertion spaces 16. The main frame 217 of the shell 21 of each liquid cooling cabin 2 has a plurality of liquid cooling chambers 217b arranged side by side along the left-right direction D3 and respectively corresponding to the plurality of insertion spaces 16, each liquid cooling chamber 217b has an opening 211 facing downwardly. The plurality of liquid cooling chambers 217b are in communication with each other, and the inlet opening 212 and the outlet opening 213 are respectively provided to two liquid cooling chambers 217b at two sides of the main frame 217, and each liquid cooling cabin 2 comprises a plurality of upper covers 218, a plurality of thermal coupling covers 22 and a plurality of elastic sealing gaskets 26 (the elastic sealing units) which respectively correspond to the liquid cooling chambers 217b. The thermal coupling plates 221a of the plurality of thermal coupling covers 22 enter into the respective corresponding insertion spaces 16 respectively by the respective windows 162.

Referring to FIG. 21 to FIG. 24, a difference of a sixth embodiment of the connector assembly of the present disclosure from the fifth embodiment lies in that, each elastic sealing unit has an elastic member 27 (the elastic component) connected between the corresponding thermal coupling cover 22 and the shell 21 and applying to the thermal coupling cover 22 and a plurality of sealing gaskets 28 (the sealing component) provided between the corresponding thermal coupling cover 22 and the shell 21 in sealing. The elastic member 27 is spring in the sixth embodiment. Specifically, the thermal coupling cover 22 further has a column 226 extending toward the inside of the shell 21 and allowing the elastic member 27 to sheathe, the upper cover 218 of the shell 21 further has a receiving structure 218b extending toward the thermal coupling cover 22 and has cylindrical shape, the receiving structure 218b is used to partially receive the elastic member 27 and the column 226. A plurality of annular grooves 222a are formed at an edge of the mounting frame 222 of the thermal coupling cover 22, the plurality of sealing gaskets 28 respectively sheathe the annular grooves 222a of the mounting frame 222 of the thermal coupling cover 22, and respectively protrude from the annular grooves 222a, to seal a gap between the thermal coupling cover 22 and the shell 21. It is noted that, in a varied embodiment, the sealing gaskets 28 also may be provided to the shell 21 to seal between the thermal coupling cover 22 and the shell 21.

Referring to FIG. 25 to FIG. 28, a difference of a seventh embodiment of the connector assembly 100 of the present disclosure from the fifth embodiment lies in that the connector assembly 100 includes two shielding cages 1 which are arranged in the up-down direction and one liquid cooling cabin 2 which is provided between the two shielding cages 1. Specifically, the liquid cooling cabin 2 is further provided on the circuit board 400 by a connecting member 500. The shell 21 of the liquid cooling cabin 2 is formed with a plurality of mounting pieces 210, each mounting piece 210 is formed with a mounting hole 210a. The connecting member 500 includes mounting columns 501 and threaded members 502 which respectively correspond to the mounting holes 210a positioned in a lower position in the plurality of mounting holes 210a. Each mounting column 501 has a threaded portion 501a which extends downwardly and fixed to the circuit board 400 by screwing and a threaded hole 501b which faces upwardly and faces the corresponding mounting hole 210a, each threaded member 502 passes through the corresponding mounting hole 210a and screws into the corresponding threaded hole 501b, so as to lock the corresponding mounting piece 210 to the corresponding mounting column 501, in turn fixedly provide the liquid cooling cabin 2 on the circuit board 400 and maintain a spacing between the liquid cooling cabin 2 and the circuit board 400. It is noted that, thread parts for the above screwing are not shown in figures.

The shell 21 of the liquid cooling cabin 2 has a main frame 219a and an upper cover 219b and a lower cover 219c which respectively cover an upper side and a lower side of the main frame 219a, the main frame 219a, the upper cover 219b and the lower cover 219c together define a plurality of liquid cooling chambers 217b which are arranged side by side along the left-right direction D3, the plurality of liquid cooling chambers 217b are in communication with each other, and the inlet opening 212 and the outlet opening 213 are respectively provided to the liquid cooling chambers 217b which are positioned to two sides of the plurality of liquid cooling chambers 217b. The upper cover 219b is formed with a plurality of openings 211 which are respectively in communication with the plurality of liquid cooling chambers 217b and respectively correspond to the plurality of insertion spaces 16 of the shielding cage 1 which is positioned at an upper side in the up-down direction D2, the lower cover 219c is formed with a plurality of openings 211 which are respectively in communication with the plurality of liquid cooling chambers 217b and respectively correspond to the plurality of insertion spaces 16 of the shielding cage 1 which is positioned at a lower side in the up-down direction D2. Thermal coupling covers 22 each are provided at the opening 211, and thermal coupling plates 221 of the thermal coupling covers 22 each enter into the insertion space 16 via the corresponding window 162.

The elastic sealing unit of the seventh embodiment is similar to the elastic sealing unit of the sixth embodiment, in the seventh embodiment, each elastic sealing unit has an elastic member 27 (the elastic component) which is connected between the corresponding thermal coupling cover 22 and the shell 21 and applies to the thermal coupling cover 22 and a plurality of sealing gaskets 28 (the sealing component) which are provided between the corresponding thermal coupling cover 22 and the shell 21 in sealing. The elastic member 27 also is spring in the seventh embodiment. Specifically, the main frame 219a has a plurality of columns 219d to allow the plurality of elastic members 27 to sheathe respectively, the thermal coupling cover 22 further has a receiving structure 227 which extends toward the main frame 219a and has cylindrical shape, the receiving structure 227 is used to partially receive the corresponding elastic member 27 and the corresponding column 219d. A plurality of annular grooves 222a are formed at an edge of the mounting frame 222 of the thermal coupling cover 22, the plurality of sealing gaskets 28 respectively sheathe annular grooves 222a of the mounting frame 222 of the thermal coupling cover 22, and respectively protrude from the annular grooves 222a, so as to seal a gap between the thermal coupling cover 22 and the shell 21.

In addition, in the seventh embodiment, the main frame 219a has a plurality of first partitioning structures 219e and a plurality of second partitioning structures 219f which are correspondingly provided to the plurality of liquid cooling chamber 217b respectively, each first partitioning structure 219e extends from the rear to the front and partitions the corresponding liquid cooling chambers 217b along the left-right direction D3, each second partitioning structure 219f extends from the front to the rear and partition the corresponding liquid cooling chambers 217b along the up-down direction D2, the plurality of first partitioning structures 219e are correspondingly connected to the plurality of second partitioning structures 219f respectively. The plurality of first partitioning structures 219e and the plurality of second partitioning structures 219f can construct the flowing passage 214 and enable the cooling liquid to more uniformly flow through a front segment of each thermal coupling cover 22. Specifically, the plurality of columns 219d are provided to the plurality of first partitioning structures 219e respectively. Moreover, the thermal coupling cover 22 further has a plurality of plates 228 which are positioned at the front segment and extend toward the interior of the shell 21, the plurality of plates 228 may increase the contact area of the cooling liquid, thereby making the cooling liquid more effective bring out heat to strengthen dissipate heat performance.

Moreover, in the seventh embodiment, the latching members 24 are provided to two sides of the shell 21 in the left-right direction D3 by tenon-mortise joint, the latching members 24 have two latching plates 244 respectively provided to two sides of the shell 21, each latching plate 244 has a plurality of tenons 244a which are positioned to a top and a bottom of the latching plate 244, the shell 21 is formed with mortises 219g which are positioned to the upper cover 219b and the lower cover 219c and which each joint with the corresponding tenon 244a, the latching plate 244 of the latching member 24 is fixedly provided to the shell 21 with the tenons 244a and the mortises 219g. Each latching plate 244 of the latching member 24 further has four latching portions 244b which respectively latch with the corresponding side walls 13 of the two shielding cages 1, two of the four latching portions 244b extend upwardly and latch with the corresponding side wall 13 of the shielding cage 1 which is positioned at the upper side in the up-down direction D2, the other two of the four latching portions 244b extend downwardly and latch with the corresponding side wall 13 of the shielding cage 1 which positioned at the lower side in the up-down direction D2, each latching portion 244b is formed with a latching hole 244c which correspondingly latches with the latching piece 131 of the corresponding side wall 13 of the shielding cage 1.

In conclusion, in the present disclosure, the liquid cooling cabin 2 is directly assembled on the shielding cage 1, the liquid cooling cabin 2 has the thermal coupling plate 221 which can elastically move, the thermal coupling plate 221 can elastically move toward a direction close to the shell 21 responding to insertion of the pluggable module 300 into the insertion space 16, and elastically restore after the pluggable module 300 is pulled out from the insertion space 16, thereby providing more effective contact pressure between the thermal coupling plate 221 and the pluggable module 300 and elastic restore capability of the thermal coupling plate 221, and by that the thermal coupling plate 221 which can elastically move directly contacts the heat source and the cooling liquid, heat dissipation efficiency of the liquid cooling cabin 2 is enhanced. In an embodiment, by the thermal coupling cover 22, the thermal coupling plate 221 which protrudes, the mounting frame 222 and a plurality of elastic connection pieces 223 integrally connected between the thermal coupling plate 221 and the mounting frame 222, which are made of a metal plate, manufacturing cost is reduced, meanwhile the sealing pad 23 integrally molded seals the gap between the elastic connection pieces 223 and seals between the mounting frame 222 of the thermal coupling cover 22 and the shell 21. In another embodiment, the elastic sealing gasket 26 seals the gap between the thermal coupling cover 22 and the shell 21, meanwhile the function of the elastic sealing gasket 26 makes that the whole thermal coupling cover 22 can relatively elastically move toward the shell 21 and elastic restore toward an opposite direction. In still another embodiment, the sealing gasket 28 seals the gap between the thermal coupling cover 22 and the shell 21, meanwhile the function of the elastic member 27 makes that the whole thermal coupling cover 22 can relatively elastically move toward the shell 21 and elastically restore toward an opposite direction.

However, what is described above is just the embodiments of the present disclosure, which is not intended to limit the scope of the present disclosure, any equivalent modifications or variations made according to the claims and specification of the present disclosure are intended to fall within the scope of the present disclosure.

What is claimed is:

1. A connector assembly, comprising:
a shielding cage comprising an insertion space and a window in communication with the insertion space; and
a liquid cooling cabin comprising a shell having an opening and a thermal coupling cover provided at the opening of the shell, the thermal coupling cover comprising a frame, a thermal coupling plate extending into the insertion space via the window of the shielding cage, and an elastic sealing unit between the frame and the thermal coupling plate, the elastic sealing unit comprising a plurality of elastic connection pieces and a conductive polymer material between the plurality of elastic connection pieces, the thermal coupling plate being elastically movable toward the shell and away from the insertion space in response to insertion of a pluggable module into the insertion space.

2. The connector assembly according to claim 1, further comprising a sealing pad positioned on a surface of the thermal coupling cover between the shell and the thermal coupling cover.

3. The connector assembly according to claim 2, wherein the sealing pad comprises the conductive polymer material for sealing liquid and for electromagnetic shielding.

4. The connector assembly according to claim 1, further comprising a sealing sheet comprising the conductive polymer material and positioned on a surface of the thermal coupling cover between the shell and the thermal coupling cover.

5. The connector assembly according to claim 4, wherein the sealing sheet seals a gap of the elastic sealing unit between the frame and the thermal coupling plate of the thermal coupling cover and seals between the shell of the liquid cooling cabin and the frame of the thermal coupling cover.

6. The connector assembly according to claim 5, wherein the plurality of elastic connection pieces are positioned between the frame and the thermal coupling plate.

7. The connector assembly according to claim 6, wherein the sealing sheet comprises a plurality of protrusions, the plurality of protrusions being inserted between the plurality of elastic connection pieces between the frame and the thermal coupling plate.

8. The connector assembly according to claim 1, wherein the frame of the thermal coupling cover comprises a plurality of first latching portions which extend upwardly from an edge of the frame and a plurality of second latching portions which extend downwardly from the edge of the frame.

9. The connector assembly according to claim 8, wherein:
the liquid cooling cabin comprises a plurality of first latching blocks that latch respectively into the plurality of first latching portions of the frame; and
the shielding cage comprises a plurality of second latching blocks that latch respectively into the plurality of second latching portions of the frame.

10. The connector assembly according to claim 1, wherein the liquid cooling cabin comprises an inlet opening, an outlet opening, and a flowing passage in fluid communication between the inlet opening and the outlet opening.

11. The connector assembly according to claim 8, wherein:
the shielding cage comprising a second insertion space and a second window in communication with the second insertion space; and
the shell of the liquid cooling cabin comprises a second opening and a second thermal coupling cover provided at the second opening of the shell, the second thermal coupling cover comprising a second frame, a second thermal coupling plate extending into the second insertion space via the second window of the shielding cage, and a second elastic sealing unit between the second frame and the second thermal coupling plate, the second thermal coupling plate being elastically movable by a function of the second elastic sealing unit.

12. A connector assembly, comprising:
a shielding cage comprising an insertion space and a window in communication with the insertion space; and
a liquid cooling cabin comprising a shell, a conductive polymer material, and a frame provided at an opening of the shell, the frame comprising a thermal coupling plate extending into the insertion space via the window of the shielding cage and a plurality of elastic connection pieces integrally connected between the thermal coupling plate and the frame, the conductive polymer material being between the plurality of elastic connection pieces, the thermal coupling plate being elastically movable toward the shell and away from the insertion space in response to insertion of a pluggable module into the insertion space.

13. The connector assembly according to claim 12, further comprising a sealing sheet comprising the conductive polymer material and positioned between the frame and the shell of the liquid cooling cabin.

14. The connector assembly according to claim 13, wherein the sealing sheet seals a gap among the plurality of elastic connection pieces between the frame and the thermal coupling plate and seals between the shell of the liquid cooling cabin and the frame.

* * * * *